(12) United States Patent
Kim et al.

(10) Patent No.: US 11,189,814 B2
(45) Date of Patent: *Nov. 30, 2021

(54) ORGANIC LIGHT EMITTING DISPLAY APPARATUS AND METHOD OF MANUFACTURING THE SAME

(71) Applicant: LG Display Co., Ltd., Seoul (KR)

(72) Inventors: SeJune Kim, Gyeonggi-do (KR); Joonsuk Lee, Seoul (KR); SoJung Lee, Gyeonggi-do (KR); Jin-Hee Jang, Seoul (KR); Jonghyeok Im, Busan (KR); JaeSung Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 139 days.

This patent is subject to a terminal disclaimer.

(21) Appl. No.: 16/368,366

(22) Filed: Mar. 28, 2019

(65) Prior Publication Data

US 2019/0252634 A1    Aug. 15, 2019

Related U.S. Application Data

(60) Continuation of application No. 15/889,659, filed on Feb. 6, 2018, now Pat. No. 10,276,838, which is a
(Continued)

(30) Foreign Application Priority Data

May 28, 2015    (KR) .......................... 10-2015-0075397

(51) Int. Cl.
*H01L 51/52*    (2006.01)
*H01L 51/56*    (2006.01)
(Continued)

(52) U.S. Cl.
CPC ........ *H01L 51/5212* (2013.01); *H01L 27/124* (2013.01); *H01L 27/1248* (2013.01);
(Continued)

(58) Field of Classification Search
CPC ............. H01L 51/5212; H01L 51/5215; H01L 51/5218; H01L 51/5206; H01L 29/43; H01L 29/4958; H01L 29/41733
See application file for complete search history.

(56) References Cited

U.S. PATENT DOCUMENTS 7,304,711 B2    12/2007    Takeguchi et al.
7,459,847 B2 *  12/2008    Kurosawa ........... H01L 51/5271
                                                                    313/504
(Continued)

FOREIGN PATENT DOCUMENTS

CN              1488976 A      4/2004

*Primary Examiner* — Sophia T Nguyen
(74) *Attorney, Agent, or Firm* — Morgan, Lewis & Bockius LLP

(57) ABSTRACT

Provided are an organic light-emitting display apparatus and a method of manufacturing the same. An organic light-emitting display apparatus includes: a substrate including an active area and a pad area, an anode electrode in the active area, an organic emission layer on the anode electrode, a cathode electrode on the organic emission layer, an auxiliary electrode connected to the cathode electrode, a signal pad in the pad area, and a first pad electrode connected to the signal pad, the first pad electrode covering a top of the signal pad, the first pad electrode being configured to prevent the top of the signal pad from being corroded, wherein the auxiliary electrode includes a first auxiliary electrode and a second auxiliary electrode connected to the first auxiliary electrode through a contact hole, and wherein the first pad electrode includes a same material as the first auxiliary electrode.

19 Claims, 12 Drawing Sheets

Related U.S. Application Data continuation of application No. 15/434,257, filed on Feb. 16, 2017, now Pat. No. 9,923,175, which is a division of application No. 14/985,483, filed on Dec. 31, 2015, now Pat. No. 9,620,733.

(51) Int. Cl.
   *H01L 27/12* (2006.01)
   *H01L 27/32* (2006.01)
   *H01L 51/00* (2006.01)

(52) U.S. Cl.
   CPC ........ *H01L 27/326* (2013.01); *H01L 27/3246* (2013.01); *H01L 27/3248* (2013.01); *H01L 27/3258* (2013.01); *H01L 27/3262* (2013.01); *H01L 27/3276* (2013.01); *H01L 51/0023* (2013.01); *H01L 51/5203* (2013.01); *H01L 51/5221* (2013.01); *H01L 51/5228* (2013.01); *H01L 51/5237* (2013.01); *H01L 51/56* (2013.01); *H01L 2227/323* (2013.01)

(56) References Cited

U.S. PATENT DOCUMENTS

| | | | | |
|---|---|---|---|---|
| 7,948,167 | B2* | 5/2011 | Chung | H01L 51/5203 313/504 |
| 8,193,695 | B2* | 6/2012 | Kim | H01L 51/5265 313/503 |
| 8,404,509 | B2* | 3/2013 | Park | H01L 27/3276 438/48 |
| 8,951,083 | B2* | 2/2015 | Choi | H01L 27/3276 445/23 |
| 9,595,687 | B2* | 3/2017 | Kang | H01L 27/3244 |
| 9,620,733 | B2* | 4/2017 | Kim | H01L 27/3246 |
| 9,923,175 | B2* | 3/2018 | Kim | H01L 27/1248 |
| 9,966,554 | B2* | 5/2018 | Lee | H01L 51/56 |
| 10,056,441 | B2* | 8/2018 | Jang | H01L 51/0023 |
| 10,276,838 | B2* | 4/2019 | Kim | H01L 27/3276 |
| 10,593,905 | B2* | 3/2020 | Lee | H01L 51/5206 |
| 10,777,766 | B2* | 9/2020 | Im | H01L 51/5228 |
| 2003/0122498 | A1* | 7/2003 | Park | H01L 27/3279 315/169.3 |
| 2003/0201716 | A1* | 10/2003 | Yamazaki | H01L 27/322 313/506 |
| 2003/0227021 | A1* | 12/2003 | Yamazaki | H01L 51/5271 257/83 |
| 2004/0080688 | A1 | 4/2004 | Ishida | |
| 2005/0051776 | A1* | 3/2005 | Miyagi | G09G 3/3233 257/72 |
| 2005/0073243 | A1* | 4/2005 | Yamazaki | H01L 51/0005 313/498 |
| 2005/0264183 | A1 | 12/2005 | Seo et al. | |
| 2005/0275339 | A1* | 12/2005 | Seo | H01L 51/5218 313/503 |
| 2006/0125390 | A1* | 6/2006 | Oh | H01L 27/3276 313/506 |
| 2006/0186804 | A1* | 8/2006 | Sakakura | H01L 27/3244 313/506 |
| 2007/0075313 | A1* | 4/2007 | Kwak | H01L 27/3276 257/59 |
| 2007/0262299 | A1* | 11/2007 | Kho | H01L 51/5218 257/40 |
| 2008/0048184 | A1* | 2/2008 | Oh | H01L 51/5206 257/40 |
| 2008/0180627 | A1* | 7/2008 | Yasuda | G02F 1/13452 349/152 |
| 2008/0218058 | A1* | 9/2008 | Son | H01L 51/5218 313/500 |
| 2008/0309233 | A1* | 12/2008 | Hasegawa | H05B 33/26 313/505 |
| 2009/0066237 | A1* | 3/2009 | Kambe | H01L 51/5218 313/504 |
| 2009/0134392 | A1* | 5/2009 | Jeong | H01L 51/5209 257/59 |
| 2009/0200544 | A1* | 8/2009 | Lee | H01L 51/5265 257/40 |
| 2009/0200937 | A1 | 8/2009 | Sagawa et al. | |
| 2009/0256477 | A1* | 10/2009 | Chung | H01L 51/5209 313/505 |
| 2009/0315451 | A1* | 12/2009 | Choi | H01L 27/3276 313/504 |
| 2010/0013383 | A1* | 1/2010 | Kim | H01L 51/5212 313/504 |
| 2010/0025097 | A1* | 2/2010 | Kojima | H01B 1/22 174/261 |
| 2010/0026178 | A1* | 2/2010 | Hwang | H01L 51/5265 313/506 |
| 2010/0066240 | A1* | 3/2010 | Park | H01L 27/3258 313/504 |
| 2010/0123387 | A1* | 5/2010 | Lee | H01L 51/5215 313/503 |
| 2011/0084257 | A1 | 4/2011 | Kwon et al. | |
| 2011/0084337 | A1* | 4/2011 | Yamazaki | H01L 27/12 257/347 |
| 2012/0001185 | A1* | 1/2012 | Lee | H01L 27/3246 257/59 |
| 2013/0056784 | A1 | 3/2013 | Lee et al. | |
| 2013/0063675 | A1* | 3/2013 | Misaki | H01L 29/7869 349/46 |
| 2013/0082270 | A1 | 4/2013 | Ono et al. | |
| 2013/0099218 | A1* | 4/2013 | Lee | H01L 51/5203 257/40 |
| 2014/0183479 | A1* | 7/2014 | Park | H01L 27/3218 257/40 |
| 2014/0183501 | A1* | 7/2014 | Kim | H01L 27/3246 257/40 |
| 2014/0312323 | A1* | 10/2014 | Park | H01L 51/525 257/40 |
| 2014/0346448 | A1 | 11/2014 | You et al. | |
| 2015/0008400 | A1 | 1/2015 | Kim | |
| 2015/0008429 | A1* | 1/2015 | Ito | H01L 21/02565 257/43 |
| 2015/0084043 | A1* | 3/2015 | Ishihara | H01L 29/66969 257/43 |
| 2015/0097171 | A1* | 4/2015 | Kim | H01L 27/326 257/40 |
| 2015/0144902 | A1* | 5/2015 | Do | H01L 27/3262 257/40 |
| 2015/0144915 | A1* | 5/2015 | Lee | H01L 22/32 257/40 |
| 2015/0144922 | A1* | 5/2015 | Moon | H01L 27/3279 257/40 |
| 2015/0155313 | A1* | 6/2015 | Yamazaki | H01L 29/78693 257/43 |
| 2015/0194449 | A1* | 7/2015 | Yu | H01L 27/1259 257/72 |
| 2016/0020422 | A1* | 1/2016 | Kim | H01L 29/45 257/40 |
| 2016/0079429 | A1* | 3/2016 | Ellinger | H01L 29/78606 257/43 |
| 2016/0093742 | A1* | 3/2016 | Momose | H01L 29/78606 257/43 |
| 2016/0190225 | A1 | 6/2016 | Kim et al. | |
| 2016/0233309 | A1* | 8/2016 | Miyamoto | H01L 29/78666 |
| 2017/0194415 | A1* | 7/2017 | Choi | H01L 51/0096 |
| 2017/0256647 | A1* | 9/2017 | Nakazawa | H01L 29/7869 |
| 2017/0288010 | A1* | 10/2017 | Han | H01L 51/5209 |
| 2017/0323907 | A1* | 11/2017 | Kitagawa | G02F 1/1343 |
| 2018/0175133 | A1* | 6/2018 | Im | H01L 51/5221 |
| 2019/0027551 | A1* | 1/2019 | Jang | H01L 27/3276 |
| 2019/0252634 | A1* | 8/2019 | Kim | H01L 51/5237 |

\* cited by examiner

ORGANIC LIGHT EMITTING DISPLAY APPARATUS AND METHOD OF MANUFACTURING THE SAME

CROSS-REFERENCE TO RELATED APPLICATION(S)

This application is a continuation of U.S. patent application Ser. No. 15/889,659, filed on Feb. 6, 2018, which is a continuation of U.S. patent application Ser. No. 15/434,257, filed on Feb. 16, 2017, which is a divisional of U.S. patent application Ser. No. 14/985,483, filed on Dec. 31, 2015 (now U.S. Pat. No. 9,620,733), which claims the benefit of Korean Patent Application No. 10-2015-0075397, filed on May 28, 2015, the entire disclosure of each of which is hereby incorporated by reference herein for all purposes.

BACKGROUND

1. Technical Field

The present disclosure relates to an organic light-emitting display apparatus, and, more particularly, to a top-emission type organic light-emitting display apparatus and a method of manufacturing the same.

2. Discussion of the Related Art

Organic light-emitting display apparatuses are self-emitting apparatuses and have low power consumption, a fast response time, high emission efficiency, high luminance, and a wide viewing angle. The organic light-emitting display apparatuses are classified into a top-emission type and a bottom-emission type, based on a transmission direction of light emitted from an organic light-emitting device. In the bottom-emission type organic light-emitting display apparatus, a circuit element is disposed between an emission layer and an image displaying surface, and for this reason, an aperture ratio is lowered. On the other hand, in the top-emission type organic light-emitting display apparatus, the circuit element is not disposed between the emission layer and the image displaying surface. Thus, an aperture ratio is enhanced.

FIG. 1 is a schematic cross-sectional view of a related art top-emission type organic light-emitting display apparatus.

As shown in FIG. 1, a thin film transistor (TFT) layer T that includes an active layer 11, a gate insulation layer 12, a gate electrode 13, an interlayer dielectric 14, a source electrode 15, and a drain electrode 16 is formed in an active area AA on a substrate 10. A passivation layer 20 and planarization layer 30 are sequentially formed on the TFT layer T.

An anode electrode 40 and an auxiliary electrode 50 are formed on the planarization layer 30. The auxiliary electrode 50 decreases a resistance of a cathode electrode 80, as will be described below.

A bank 60 is formed on the anode electrode 40 and the auxiliary electrode 50 and defines a pixel area. An organic emission layer 70 is formed in the pixel area defined by the bank 60, and the cathode electrode 80 is formed on the organic emission layer 70.

In the top-emission type organic light-emitting display apparatus, light emitted from the organic emission layer 70 passes through the cathode electrode 80. Therefore, the cathode electrode 80 is formed of a transparent conductive material, and a resistance of the cathode electrode 80 increases. To decrease the resistance of the cathode electrode 80, the cathode electrode 80 is connected to the auxiliary electrode 50.

The gate insulation layer 12 and the interlayer dielectric 14 are formed in a pad area PA on the substrate 10, a signal pad 90 is formed on the interlayer dielectric 14, and the passivation layer 20 is formed on the signal pad 90. A hole is provided in the passivation layer 20, and the signal pad 90 is exposed to the outside through the hole. Because the signal pad 90 should be connected to an external driving circuit, the signal pad 90 is exposed to the outside by forming the hole in the passivation layer 20.

The related art top-emission type organic light-emitting display apparatus has the following problems.

Because the signal pad 90 should be connected to the external driving circuit, a top of the signal pad 90 is exposed to the outside. For this reason, the top of the signal pad 90 is corroded, and the corrosion can spread to another area. A metal layer having excellent corrosion resistance may be further formed on the top of the signal pad 90 to prevent the top of the signal pad 90 from being corroded. However, in this case, the number of processes increases. Also, an electrode layer, which is the same as the anode electrode 40, may be formed on the signal pad 90 through the same process to prevent the top of the signal pad 90 from being corroded without an increase in number of processes. Even in this case, however, it is unable to prevent a material of the electrode material from being corroded, or it is unable to prevent corrosion from being spread through a side surface of the electrode layer.

Moreover, to connect the signal pad 90 to the external driving circuit, the top of the signal pad 90 is exposed by forming the hole in the passivation layer 20, but when the hole of the passivation layer 20 is previously formed, an etchant for pattern-forming the anode electrode 40 flows through the hole and damages the signal pad 90. To prevent the damage, a process of forming the hole of the passivation layer 20 for exposing the top of the signal pad 90 may be separately performed after a process of pattern-forming the anode electrode 40 is completed, but in this case, a separate (additional) mask process is added.

SUMMARY

Accordingly, the present disclosure is directed to an organic light-emitting display apparatus and a method of manufacturing the same that substantially obviate one or more of the problems due to limitations and disadvantages of the related art.

An object of the present disclosure is to provide a top-emission type organic light-emitting display apparatus and a method of manufacturing the same, in which the number of additional processes is minimized, and a signal pad is prevented from being corroded.

Additional features and advantages will be set forth in the description which follows, and in part will be apparent from the description, or may be learned by practice of the invention. The objectives and other advantages of the disclosure will be realized and attained by the structure particularly pointed out in the written description and claims thereof as well as the appended drawings.

To achieve these and other advantages and in accordance with the purpose of the present disclosure, as embodied and broadly described, there is provided an organic light-emitting display apparatus, including: a substrate including an active area and a pad area, an anode electrode in the active area of the substrate, an organic emission layer on the anode electrode, a cathode electrode on the organic emission layer, an auxiliary electrode connected to the cathode electrode, a signal pad in the pad area of the substrate, and a first pad electrode connected to the signal pad, the first pad electrode covering a top of the signal pad, the first pad electrode being configured to prevent the top of the signal pad from being corroded, wherein the auxiliary electrode includes a first auxiliary electrode and a second auxiliary electrode connected to the first auxiliary electrode through a contact hole, and wherein the first pad electrode includes a same material as the first auxiliary electrode.

In another aspect, there is provided a method of manufacturing an organic light-emitting display apparatus, the method including: forming, on a substrate: a source electrode, a drain electrode, and a signal pad, forming a passivation layer on the source electrode, the drain electrode, and the signal pad, forming a first contact hole externally exposing the source electrode or the drain electrode by removing a predetermined region of the passivation layer, forming a second contact hole externally exposing the signal pad by removing another partial region of the passivation layer, forming a first anode electrode connected to the source electrode or the drain electrode, forming a first auxiliary electrode separated from the first anode electrode, forming a first pad electrode connected to the signal pad, the first pad electrode being formed of a same material as the first auxiliary electrode, forming a third contact hole externally exposing the first anode electrode, and forming a fourth contact hole externally exposing the first auxiliary electrode.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

Figure 1:
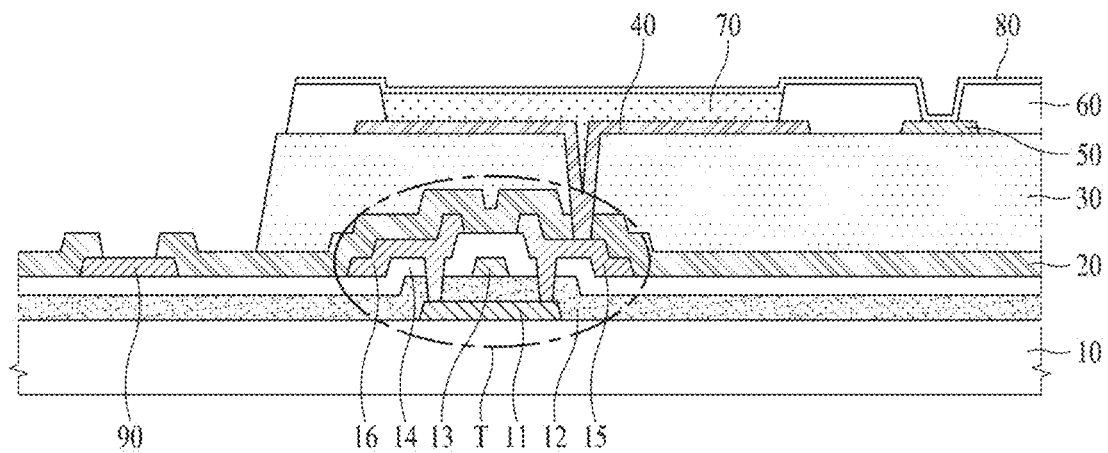
FIG. 1 is a schematic cross-sectional view of a related art top-emission type organic light-emitting display apparatus.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Hereinafter, example embodiments of the present disclosure will be described in detail with reference to the accompanying drawings.

Figure 2:
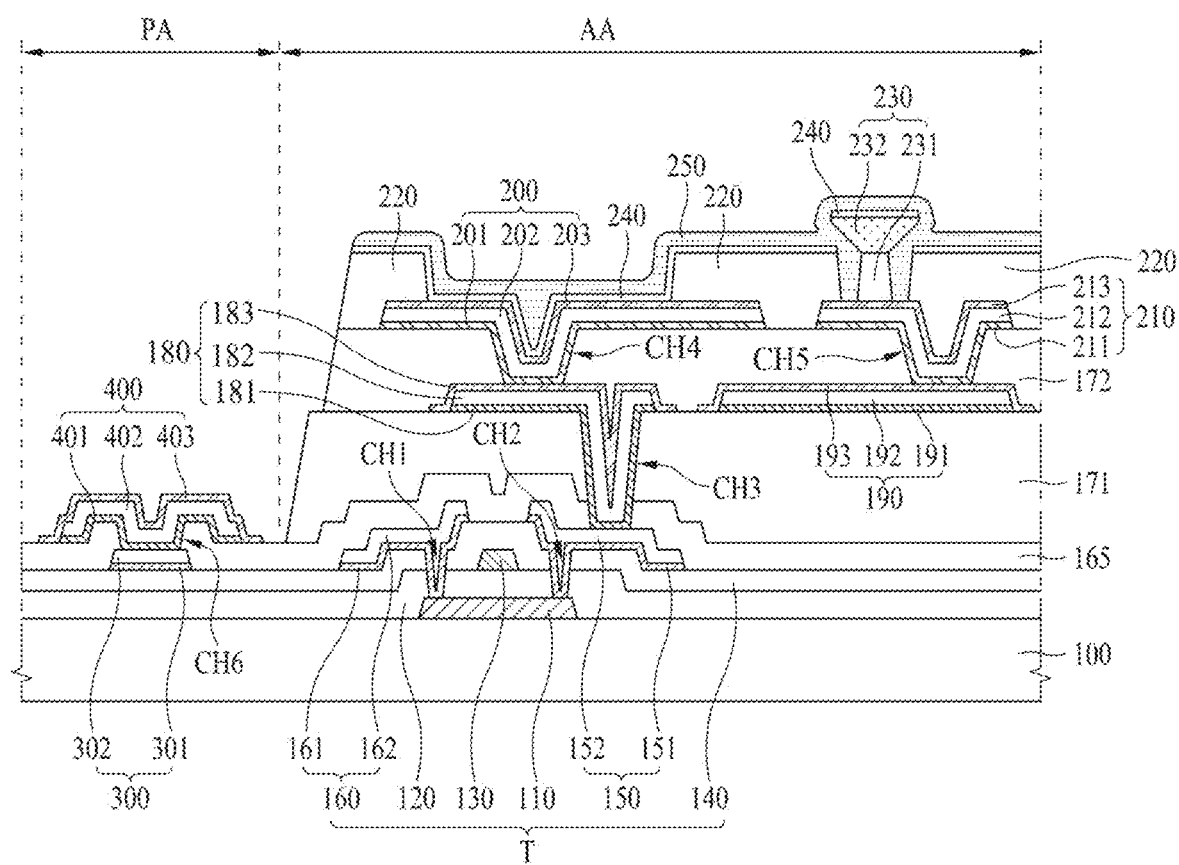
FIG. 2 is a cross-sectional view of an organic light-emitting display apparatus according to an example embodiment of the present disclosure.

FIG. 2 is a cross-sectional view of an organic light-emitting display apparatus according to an example embodiment of the present disclosure.

As shown in FIG. 2, the organic light-emitting display apparatus according to an example embodiment of the present disclosure may include an active area AA and a pad area PA which are included in a substrate 100. A thin film transistor (TFT) T, a passivation layer 165, a first planarization layer 171, a second planarization layer 172, a first anode electrode 180, a second anode electrode 200, a first auxiliary electrode 190, a second auxiliary electrode 210, a bank 220, a partition wall 230, an organic emission layer 240, and a cathode electrode 250 may be formed in the active area AA of the substrate 100.

The TFT T may include an active layer 110, a gate insulation layer 120, a gate electrode 130, an interlayer dielectric 140, a source electrode 150, and a drain electrode 160. The active layer 110 may be formed on the substrate 100 to overlap the gate electrode 130. The active layer 110 may be formed of a silicon-based semiconductor material, or may be formed of an oxide-based semiconductor material. Although not shown, a light-shielding layer may be further formed between the substrate 100 and the active layer 110. For example, external light incident through a bottom of the substrate 100 may be blocked by the light shielding layer, thereby preventing the active layer 110 from being damaged by the external light.

The gate insulation layer 120 may be formed on the active layer 110. The gate insulation layer 120 may insulate the active layer 110 from the gate electrode 130. The gate insulation layer 120 may be formed of an inorganic insulating material, for example, silicon oxide ($SiO_x$), silicon nitride (SiN$_x$), or a multilayer thereof, but embodiments are not limited thereto. The gate insulation layer 120 may extend to the pad area PA.

The gate electrode 130 may be formed on the gate insulation layer 120. The gate electrode 130 may be formed to overlap the active layer 110 with the gate insulation layer 120 therebetween. The gate electrode 130 may be formed of a single layer or a multilayer formed, for example, of one of molybdenum (Mo), aluminum (Al), chromium (Cr), gold (Au), titanium (Ti), nickel (Ni), neodymium (Nd), and copper (Cu) or an alloy thereof, but embodiments are not limited thereto.

The interlayer dielectric 140 may be formed on the gate electrode 130. The interlayer dielectric 140 may be formed of the same inorganic insulating material as that of the gate insulation layer 120, for example, silicon oxide (SiO$_x$), silicon nitride (SiN$_x$), or a multilayer thereof, but embodiments are not limited thereto. The interlayer dielectric 140 may extend to the pad area PA.

The source electrode 150 and the drain electrode 160 may be formed to face each other on the interlayer dielectric 140. A first contact hole CH1 exposing one end region of the active layer 110 and a second contact hole CH2 exposing the other end region of the active layer 110 may be provided in the gate insulation layer 120 and the interlayer dielectric 140. The source electrode 150 may be connected to the other end region of the active layer 110 through the second contact hole CH2, and the drain electrode 160 may be connected to the one end region of the active layer 110 through the first contact hole CH1.

The source electrode 150 may include a lower source electrode 151 and an upper source electrode 152. The lower source electrode 151 may be formed between the interlayer dielectric 140 and the upper source electrode 152 and may enhance an adhesive force between the interlayer dielectric 140 and the upper source electrode 152. Also, the lower source electrode 151 may protect a bottom of the upper source electrode 152, thereby preventing the bottom of the upper source electrode 152 from being corroded. Therefore, an oxidation rate of the lower source electrode 151 may be lower than that of the upper source electrode 152. That is, the lower source electrode 151 may be formed of a material that is stronger in corrosion resistance than a material forming the upper source electrode 152. As described above, the lower source electrode 151 may act as an adhesion enhancement layer or an anti-corrosion layer and may be formed of an alloy (MoTi) of molybdenum (Mo) and titanium (Ti), but embodiments are not limited thereto.

The upper source electrode 152 may be formed on a top of the lower source electrode 151. The upper source electrode 152 may be formed of copper (Cu), which is a metal having a low resistance, but embodiments are not limited thereto. The upper source electrode 152 may be formed of metal which is relatively lower in resistance than the lower source electrode 151. In order to lower a total resistance of the source electrode 150, a thickness of the upper source electrode 152 may be formed thicker than that of the lower source electrode 151.

Similarly to the above-described source electrode 150, the drain electrode 160 may include a lower drain electrode 161 and an upper drain electrode 162. The lower drain electrode 161 may be formed between the interlayer dielectric 140 and the upper drain electrode 162. The lower drain electrode 161 may enhance an adhesive force between the interlayer dielectric 140 and the upper drain electrode 162, and may also prevent a bottom of the upper drain electrode 162 from being corroded. Therefore, an oxidation rate of the lower drain electrode 161 may be lower than that of the upper drain electrode 162. That is, the lower drain electrode 161 may be formed of a material having a stronger corrosion resistance than a material forming the upper drain electrode 162. As described above, the lower drain electrode 161 may be formed of an alloy (MoTi) of molybdenum (Mo) and titanium (Ti), similarly to the above-described material of the lower source electrode 151, but embodiments are not limited thereto.

The upper drain electrode 162 may be formed on top of the lower drain electrode 161 and may be formed of copper (Cu), similarly to the above-described material of the upper source electrode 152, but embodiments are not limited thereto. The upper drain electrode 162 may be thicker than that of the lower drain electrode 161, thereby lowering a total resistance of the drain electrode 160.

The upper drain electrode 162 may be formed of the same material as that of the upper source electrode 152, and may have the same thickness as that of the upper source electrode 152, and the lower drain electrode 161 may be formed of the same material as that of the lower source electrode 151, and may have the same thickness as that of the lower source electrode 151. In some embodiments, the drain electrode 160 and the source electrode 150 may be simultaneously formed through the same process.

A structure of the TFT T is not limited to the illustrated structure, and may be variously modified to structures known to those skilled in the art. For example, a top gate structure in which the gate electrode 130 is formed on the active layer 110 is illustrated in the FIG. 2 example, but the TFT T may alternatively be formed in a bottom gate structure in which the gate electrode 130 is formed under the active layer 110.

The passivation layer 165 may be formed on the TFT T, and, for example, may be formed on tops of the source electrode 150 and the drain electrode 160. The passivation layer 165 protects the TFT T. The passivation layer 165 may be formed of an inorganic insulating material (for example, SiO$_x$ and SiN$_x$), but embodiments are not limited thereto. The passivation layer 165 may extend to the pad area PA.

The first planarization layer 171 may be formed on the passivation layer 165. The first planarization layer 171 may planarize an upper surface of the substrate 100 including the TFT T. The first planarization layer 171 may be formed of an organic insulating material, such as acryl resin, epoxy resin, phenolic resin, polyamide resin, polyimide resin, or the like, but embodiments are not limited thereto. The first planarization layer 171 may not extend to the pad area PA.

The first anode electrode 180 and the first auxiliary electrode 190 may be formed on the first planarization layer 171. That is, the first anode electrode 180 and the first auxiliary electrode 190 may be formed on the same layer. A third contact hole CH3 exposing the source electrode 150 may be provided in the passivation layer 165 and the first planarization layer 171, and the source electrode 150 may be connected to the first anode electrode 180 through the third contact hole CH3. In some embodiments, the first anode electrode 180 may be connected with the source electrode 150. However, the source electrode 150 and the drain electrode 160 can be switched based on the mode of the transistor. Accordingly, in some embodiments, the first anode electrode 180 may be connected with the drain electrode 160 instead of the source electrode 150. As a result, the first anode electrode 180 may be connected with the source electrode 150 or the drain electrode 160.

The first anode electrode 180 may include a first lower anode electrode 181, a first upper anode electrode 182, and a first cover anode electrode 183. The first lower anode electrode 181 may be formed between the first planarization layer 171 and the first upper anode electrode 182, and may enhance an adhesive force between the first planarization layer 171 and the first upper anode electrode 182. Also, the first lower anode electrode 181 may protect a bottom of the first upper anode electrode 182, thereby preventing the bottom of the first upper anode electrode 182 from being corroded. Therefore, an oxidation rate of the first lower anode electrode 181 may be lower than that of the first upper anode electrode 182. That is, the first lower anode electrode 181 may be formed of a material having a stronger corrosion resistance than a material forming the first upper anode electrode 182. Also, the first lower anode electrode 181 may protect a top of the upper source electrode 152, thereby preventing the top of the upper source electrode 152 from being corroded. Therefore, an oxidation rate of the first lower anode electrode 181 may be lower than that of the upper source electrode 152. That is, the first lower anode electrode 181 may be formed of a material having a stronger corrosion resistance than a material forming the upper source electrode 152. As described above, the first lower anode electrode 181 may prevent the top of the upper source electrode 152 from being corroded. Thus, the source electrode 150 may be formed in the above-described two-layer structure. The first lower anode electrode 181 may act as an adhesion enhancement layer or an anti-corrosion layer and may be formed of an alloy (MoTi) of molybdenum (Mo) and titanium (Ti), but embodiments are not limited thereto.

The first upper anode electrode 182 may be formed between the first lower anode electrode 181 and the first cover anode electrode 183. The first upper anode electrode 182 may be formed of copper (Cu), which is a metal having a low resistance, but embodiments are not limited thereto. The first upper anode electrode 182 may be formed of metal which is relatively lower in resistance than the first lower anode electrode 181. To lower a total resistance of the first anode electrode 180, the first upper anode electrode 182 may be thicker than that of each of the first lower anode electrode 181 and the first cover anode electrode 183.

The first cover anode electrode 183 may be formed on the first upper anode electrode 182. The first cover anode electrode 183 may be formed to cover a top and a side surface of the first upper anode electrode 182, thereby preventing the first upper anode electrode 182 from being corroded. To this end, an oxidation rate of the first cover anode electrode 183 may be lower than that of the first upper anode electrode 182. That is, the first cover anode electrode 183 may be formed of a material having a stronger corrosion resistance than a material forming the first upper anode electrode 182.

The first cover anode electrode 183 may cover up to a side surface of the first lower anode electrode 181. In such a case, an oxidation rate of the first cover anode electrode 183 may be lower than that of the first lower anode electrode 181. That is, the first cover anode electrode 183 may be formed of a material having a stronger corrosion resistance than a material forming the first lower anode electrode 181. The first cover anode electrode 183 may be formed of a transparent conductive material, such as indium tin oxide (ITO) or the like, but embodiments are not limited thereto.

Similarly to the above-described first anode electrode 180, the first auxiliary electrode 190 may include a first lower auxiliary electrode 191, a first upper auxiliary electrode 192, and a first cover auxiliary electrode 183. The first lower auxiliary electrode 191 may be formed between the first planarization layer 171 and the first upper auxiliary electrode 192. The first lower auxiliary electrode 191 may enhance an adhesive force between the first planarization layer 171 and the first upper auxiliary electrode 192, and may also prevent a bottom of the first upper auxiliary electrode 192 from being corroded. Therefore, an oxidation rate of the first lower auxiliary electrode 191 may be lower than that of the first upper auxiliary electrode 192. That is, the first lower auxiliary electrode 191 may be formed of a material having a stronger corrosion resistance than a material forming the first upper auxiliary electrode 192. As described above, the first lower auxiliary electrode 191 may be formed of an alloy (MoTi) of molybdenum (Mo) and titanium (Ti), which is similar to the above-described material of the first lower anode electrode 181, but embodiments are not limited thereto.

The first upper auxiliary electrode 192 may be formed between the first lower auxiliary electrode 191 and the first cover auxiliary electrode 193 and may be formed of copper (Cu), which similar to the above-described material of the first upper anode electrode 182, but embodiments are not limited thereto. The first upper auxiliary electrode 192 (which has a relatively low resistance) may be thicker than that of each of the first lower auxiliary electrode 191 and the first cover auxiliary electrode 193 (which have relatively high resistances), thereby lowering a total resistance of the first auxiliary electrode 190.

The first cover auxiliary electrode 193 may be formed on the first upper auxiliary electrode 192. The first cover auxiliary electrode 193 may be formed to cover a top and a side surface of the first upper auxiliary electrode 192, thereby preventing the first upper auxiliary electrode 192 from being corroded. To this end, an oxidation rate of the first cover auxiliary electrode 193 may be lower than that of the first upper auxiliary electrode 192. That is, the first cover auxiliary electrode 193 may be formed of a material having a stronger corrosion resistance than a material forming the first upper auxiliary electrode 192.

The first cover auxiliary electrode 193 may cover up to a side surface of the first lower auxiliary electrode 191. In this case, an oxidation rate of the first cover auxiliary electrode 193 may be lower than that of the first lower auxiliary electrode 191. That is, the first cover auxiliary electrode 193 may be formed of a material having a stronger corrosion resistance than a material forming the first lower auxiliary electrode 191. The first cover auxiliary electrode 193 may be formed of a transparent conductive material, such as ITO or the like, but embodiments are not limited thereto.

The first cover auxiliary electrode 193 may be formed of the same material as that of the first cover anode electrode 183, and may have the same thickness as that of the first cover anode electrode 183. The first upper auxiliary electrode 192 may be formed of the same material as that of the first upper anode electrode 182, and may have the same thickness as that of the first upper anode electrode 182. The first lower auxiliary electrode 191 may be formed of the same material as that of the first lower anode electrode 181, and may have the same thickness as that of the first lower anode electrode 181. In some embodiments, the first auxiliary electrode 190 and the first anode electrode 180 may be formed simultaneously through the same process.

The second planarization layer 172 may be formed on the first auxiliary electrode 190 and the first anode electrode 180. The second planarization layer 172 may planarize an upper surface of the substrate 100 along with the above-described first planarization layer 171. The second planarization layer 172 may be formed of an organic insulating material, such as acryl resin, epoxy resin, phenolic resin, polyamide resin, polyimide resin, or the like, but embodiments are not limited thereto. The second planarization layer 172 may not extend to the pad area PA.

A fourth contact hole CH4 and a fifth contact hole CH5 may be included in the second planarization layer 172. The first anode electrode 180 may be exposed by the fourth contact hole CH4, and the first auxiliary electrode 190 may be exposed by the fifth contact hole CH5.

The second anode electrode 200 may be formed on the second planarization layer 172. The second anode electrode 200 may be connected to the first anode electrode 180 through the fourth contact hole CH4. The second anode electrode 200 may reflect light, emitted from the organic emission layer 240, in an upward direction, and the second anode electrode 200 may be formed of a highly reflective material.

The second anode electrode 200 may include a second lower anode electrode 201, a second center anode electrode 202, and a second upper anode electrode 203. The second lower anode electrode 201 may be formed between the first anode electrode 180 and the second center anode electrode 202. The second lower anode electrode 201 may protect a bottom of the second center anode electrode 202, thereby preventing the bottom of the second center anode electrode 202 from being corroded. An oxidation rate of the second lower anode electrode 201 may be lower than that of the second center anode electrode 202. That is, the second lower anode electrode 201 may be formed of a material having a stronger corrosion resistance than a material forming the second center anode electrode 202. The second lower anode electrode 201 may be formed of a transparent conductive material, such as ITO or the like, but embodiments are not limited thereto.

The second center anode electrode 202 may be formed between the second lower anode electrode 201 and the second upper anode electrode 203. The second center anode electrode 202 may be formed of a material having a lower resistance and a better reflectivity than the second lower anode electrode 201 and the second upper anode electrode 203. For example, the second center anode electrode 202 may be formed of silver (Ag). However, embodiments are not limited thereto. A thickness of the second center anode electrode 202 (which has a relatively low resistance) may be formed thicker than that of each of the second lower anode electrode 201 and the second upper anode electrode 203 (which have relatively high resistances), thereby lowering a total resistance of the second anode electrode 200.

The second upper anode electrode 203 may be formed on a top of the second center anode electrode 202, thereby preventing the top of the second center anode electrode 202 from being corroded. To this end, an oxidation rate of the second upper anode electrode 203 may be lower than that of the second center anode electrode 202. That is, the second upper anode electrode 203 may be formed of a material having a stronger corrosion resistance than a material forming the second center anode electrode 202. The second upper anode electrode 203 may be formed of a transparent conductive material, such as ITO or the like, but embodiments are not limited thereto.

The second auxiliary electrode 210 may be formed on the second planarization layer 172 identically to the second anode electrode 200. The second auxiliary electrode 210 may be connected to the first auxiliary electrode 190 through the fifth contact hole CH5. The second auxiliary electrode 210 may lower a resistance of the cathode electrode 250 along with the first auxiliary electrode 190.

The second auxiliary electrode 210 may include a second lower auxiliary electrode 211, a second center auxiliary electrode 212, and a second upper auxiliary electrode 213. The second lower auxiliary electrode 211 may be formed between the first auxiliary electrode 190 and the second center auxiliary electrode 212. The second lower auxiliary electrode 211 may protect a bottom of the second center auxiliary electrode 212, thereby preventing the bottom of the second center auxiliary electrode 212 from being corroded. To this end, an oxidation rate of the second lower auxiliary electrode 211 may be lower than that of the second center auxiliary electrode 212. That is, the second lower auxiliary electrode 211 may be formed of a material having a stronger corrosion resistance than a material forming the second center auxiliary electrode 212. The second lower auxiliary electrode 211 may be formed of a transparent conductive material, such as ITO or the like, but embodiments are not limited thereto.

The second center auxiliary electrode 212 may be formed between the second lower auxiliary electrode 211 and the second upper auxiliary electrode 213. The second center auxiliary electrode 212 may be formed of a material which having a lower resistance and a better reflectivity than the second lower auxiliary electrode 211 and the second upper auxiliary electrode 213, and for example, may be formed of silver (Ag). However, the present embodiment is not limited thereto. A thickness of the second center auxiliary electrode 212 which is relatively low in resistance may be formed thicker than that of each of the second lower auxiliary electrode 211 and the second upper auxiliary electrode 213 which are relatively high in resistance, thereby lowering a total resistance of the second auxiliary electrode 210.

The second upper auxiliary electrode 213 may be formed on a top of the second center auxiliary electrode 212, thereby preventing the top of the second center auxiliary electrode 212 from being corroded. To this end, an oxidation rate of the second upper auxiliary electrode 213 may be lower than that of the second center auxiliary electrode 212. That is, the second upper auxiliary electrode 213 may be formed of a material having a stronger corrosion resistance than a material forming the second center auxiliary electrode 212. The second upper auxiliary electrode 213 may be formed of a transparent conductive material, such as ITO or the like, but embodiments are not limited thereto.

The second upper auxiliary electrode 213 may be formed of the same material as that of the second upper anode electrode 203, and may have the same thickness as that of the second upper anode electrode 203. The second center auxiliary electrode 212 may be formed of the same material as that of the second center anode electrode 202, and may have the same thickness as that of the second center anode electrode 202. The second lower auxiliary electrode 211 may be formed of the same material as that of the second lower anode electrode 201, and may have the same thickness as that of the second lower anode electrode 201. In some embodiments, the second auxiliary electrode 210 and the second anode electrode 200 may be simultaneously formed through the same process.

According to an embodiment of the present disclosure, two auxiliary electrodes (for example, the first and second auxiliary electrodes 190 and 210) connected to each other may be formed for lowering the resistance of the cathode electrode 250. Thus, the desired resistance characteristic of an auxiliary electrode may be more easily adjusted.

Because the second auxiliary electrode 210 may be formed on the same layer as a layer on which the second anode electrode 200 is disposed, a width of the second anode electrode 200 may be reduced when a width of the second auxiliary electrode 210 increases. In this case, a pixel area of a display apparatus may be reduced. As such, there may be a limitation in increasing the width of the second auxiliary electrode 210. Therefore, according to an embodiment of the present disclosure, the first auxiliary electrode 190 connected to the second auxiliary electrode 210 may be further formed under the second auxiliary electrode 210. Thus, the resistance of the cathode electrode 150 may be effectively lowered, even without any reduction in a pixel area.

The first auxiliary electrode 190 may be formed on the same layer as a layer on which the first anode electrode 180 is disposed. Because the first anode electrode 180 may connect the source electrode 150 to the second anode electrode 200, a width of the first anode electrode 180 may be reduced, thereby increasing a width of the first auxiliary electrode 190. That is, the width of the first auxiliary electrode 190 may be formed greater than that of the first anode electrode 180. In addition, the width of first auxiliary electrode 190 may increase so the first auxiliary electrode 190 may overlap the second anode electrode 200, whereby the resistance of the cathode electrode 150 may be more effectively lowered.

The bank 220 may be formed on the second anode electrode 200 and the second auxiliary electrode 210. The bank 220 may be formed on one side and the other side (e.g., both sides) of the second anode electrode 200 to expose a top of the second anode electrode 200. Because the bank 220 may be formed to expose the top of the second anode electrode 200, an area where an image is displayed may be secured. Also, because the bank 220 may be formed on the one side and the other side of the second anode electrode 200, a side surface of the second center anode electrode 202 vulnerable to corrosion may be prevented from being exposed to the outside, thereby preventing the side surface of the second center anode electrode 202 from being corroded.

The bank 220 may be formed on one side and the other side (e.g., on both sides) of the second auxiliary electrode 210 to expose a top of the second auxiliary electrode 210. Because the bank 220 may be formed to expose the top of the second auxiliary electrode 210, an electrical connection space between the second auxiliary electrode 210 and the cathode electrode 250 may be secured. Also, because the bank 220 may be formed on the one side and the other side of the second auxiliary electrode 210, a side surface of the second center auxiliary electrode 212 vulnerable to corrosion may be prevented from being exposed to the outside, thereby preventing the side surface of the second center auxiliary electrode 212 from being corroded.

Moreover, the bank 220 may be formed between the second anode electrode 200 and the second auxiliary electrode 210, and may insulate the second anode electrode 200 from the second auxiliary electrode 210. The bank 220 may be formed of an organic insulating material, such as polyimide resin, acryl resin, benzocyclobutene (BCB), or the like, but embodiments are not limited thereto.

The partition wall 230 may be formed on the second auxiliary electrode 210. The partition wall 230 may be separated from the bank 220 by a certain distance, and the second auxiliary electrode 210 may be electrically connected to the cathode electrode 250 through a separation space between the partition wall 230 and the bank 220. The second auxiliary electrode 210 may be electrically connected to the cathode electrode 250 without forming the partition wall 230. However, if the partition wall 230 is formed, the organic emission layer 240 may be more easily deposition-formed. The formation of the partition wall 230 will be described below in more detail.

If the partition wall 230 is not formed, a mask pattern that covers a top of the second auxiliary electrode 210 may be used in depositing the organic emission layer 240, so that the top of the second auxiliary electrode 210 may not be covered by the organic emission layer 240. However, if the partition wall 230 is formed, a top of the partition wall 230 may act as an eaves shape or overhang in depositing the organic emission layer 240. Thus, because the organic emission layer 240 may not be deposited under the eaves, the mask pattern which covers the top of the second auxiliary electrode 210 may not be needed. That is, in a front view of an example of the organic light-emitting display apparatus, when the top of the partition wall 230 that acts as eaves is formed to cover a separation space between the partition wall 230 and the bank 220, the organic emission layer 240 may not penetrate into the separation space between the partition wall 230 and the bank 220. Thus, the second auxiliary electrode 210 may be exposed in the separation space between the partition wall 230 and the bank 220. For example, the organic emission layer 240 may be formed by a deposition process, such as an evaporation process, which may be excellent in terms of accuracy and straightness of deposition of a deposited material. However, embodiments are not limited thereto. Thus, the organic emission layer 240 may not be deposited in the separation space between the partition wall 230 and the bank 220.

As described above, a width of the top of the partition wall 230 may be greater than that of a bottom of the partition wall 230, such that the top of the partition wall 230 may act as the eaves. The partition wall 230 may include a lower first partition wall 231 and an upper second partition wall 232. The first partition wall 231 may be formed on a top of the second auxiliary electrode 210, and may be formed of the same material as that of the bank 220, may be formed through the same process as that of the bank 220. The second partition wall 232 may be formed on a top of the first partition wall 231. A width of a top of the second partition wall 232 may be formed greater than that of a bottom of the second partition wall 232. For example, the top of the second partition wall 232 may be formed to cover the separation space between the partition wall 230 and the bank 220, and may act as eaves.

The organic emission layer 240 may be formed on the second anode electrode 200. The organic emission layer 240 may include a hole injection layer, a hole transport layer, an emission layer, an electron transport layer, and an electron injection layer. The organic emission layer 240 may be modified to have various structures known to those skilled in the art.

The organic emission layer 240 may extend to the top of the bank 220. However, the organic emission layer 240 may not extend to the top of the second auxiliary electrode 210 to cover the top of the second auxiliary electrode 210. This is because, if the organic emission layer 240 covers the top of the second auxiliary electrode 210, it may be difficult to electrically connect the second auxiliary electrode 210 to the cathode electrode 250. As described above, the organic emission layer 240 may be formed by a deposition process without a mask that covers the top of the second auxiliary electrode 210. For example, the organic emission layer 240 may be formed on the top of the partition wall 230.

The cathode electrode 250 may be formed on the organic emission layer 240. The cathode electrode 250 may be formed on a surface from which light is emitted, and thus may be formed of a transparent conductive material.

Because the cathode electrode 250 may be formed of a transparent conductive material, a resistance of the cathode electrode 250 may be high. For example, in order to lower the resistance of the cathode electrode 250, the cathode electrode 250 may be connected to the second auxiliary electrode 210. Also, the cathode electrode 250 may be connected to the second auxiliary electrode 210 through the separation space between the partition wall 230 and the bank 220. The cathode electrode 250 may be formed by a deposition process, such as a sputtering process, which may not be as accurate or provide as much straightness of deposition of a deposited material. However, embodiments are not limited thereto. Thus, the cathode electrode 250 may be deposited in the separation space between the partition wall 230 and the bank 220 in a process of depositing the cathode electrode 250.

Although not shown, an encapsulation layer may be further formed on the cathode electrode 250, and may prevent penetration of water. The encapsulation layer may use various materials known to those skilled in the art. Also, although not shown, a color filter may be further formed for each pixel and on the cathode electrode 250. For example, white light may be emitted from the organic emission layer 240.

The gate insulation layer 120, the interlayer dielectric 140, the signal pad 300, the passivation layer 165, and a first pad electrode 400 may be formed in the pad area PA of the substrate 100. The gate insulation layer 120 may be formed on the substrate 100, and the interlayer dielectric 140 may be formed on the gate insulation layer 120. The gate insulation layer 120 and the interlayer dielectric 140 may extend from the active area AA and may be formed all over the pad area PA.

The signal pad 300 may be formed on the interlayer dielectric 140. The signal pad 300 may be formed on the same layer as a layer where the source electrode 150 and the drain electrode 160 in the active area AA are disposed.

The signal pad 300 may include a lower signal pad 301 and an upper signal pad 302. The lower signal pad 301 may be formed between the interlayer dielectric 140 and the upper signal pad 302, and may enhance an adhesive force between the interlayer dielectric 140 and the upper signal pad 302. Also, the lower signal pad 301 may prevent a bottom of the upper signal pad 302 from being corroded. Therefore, an oxidation rate of the lower signal pad 301 may be lower than that of the upper signal pad 302. That is, the lower signal pad 301 may be formed of a material having a stronger corrosion resistance than a material forming the upper signal pad 302. As described above, the lower signal pad 301 may be formed of an alloy (MoTi) of molybdenum (Mo) and titanium (Ti), which may be similar to the above-described material of the lower source electrode 151 or the lower drain electrode 161, but embodiments are not limited thereto.

The upper signal pad 302 may be formed on a top of the lower signal pad 301. The upper signal pad 302 may be formed of copper (Cu), which is metal having a low resistance, but embodiments are not limited thereto. The upper signal pad 302 may be formed of metal which is relatively lower in resistance than the lower signal pad 301. To lower a total resistance of the signal pad 300, the upper signal pad 302 may be thicker than the lower signal pad 301.

The upper signal pad 302 may be formed of the same material as that of the upper source electrode 152 and/or the upper drain electrode 162, and may have the same thickness as that of the upper source electrode 152 and/or the upper drain electrode 162. The lower signal pad 301 may be formed of the same material as that of the lower source electrode 151 and/or the lower drain electrode 161, and may have the same thickness as that of the lower source electrode 151 and/or the lower drain electrode 161. For example, the signal pad 300 and the source electrode 150; the signal pad 300 and the drain electrode 160; or the signal pad 300, the source electrode 150, and the drain electrode 160 may be formed simultaneously through the same process.

The passivation layer 165 may be formed on the signal pad 300. The passivation layer 165 may extend from the active area AA. A sixth contact hole CH6 exposing a portion of the signal pad 300 may be included in the passivation layer 165. The first pad electrode 400 may be formed on the passivation layer 165. The first pad electrode 400 may be connected to the signal pad 300 through the sixth contact hole CH6. The first pad electrode 400 may be exposed to the outside and connected to an external driver.

The first pad electrode 400 may protect a top of the signal pad 300. The top of the signal pad 300 may be configured by the upper signal pad 302 which is relatively vulnerable to corrosion. Thus, the first pad electrode 400 may be formed to cover the top of the upper signal pad 302 exposed through the sixth contact hole CH6, thereby preventing the upper signal pad 302 from being corroded. As described above, because the first pad electrode 400 may prevent the top of the upper signal pad 302 from being corroded, the signal pad 300 may be formed in the above-described two-layer structure. An oxidation rate of the first pad electrode 400, e.g., an oxidation rate of the first cover pad electrode 403, may be lower than that of the upper signal pad 302. That is, the first pad electrode 400, e.g., the first cover pad electrode 403, may be formed of a material having a stronger corrosion resistance than a material forming the upper signal pad 302. Also, because the first pad electrode 400 may be exposed to the outside, the first cover pad electrode 403 corresponding to an uppermost surface of the first pad electrode 400 may be formed of a material having a strong corrosion resistance.

The first pad electrode 400 may be formed of the same material as that of the first anode electrode 180 and/or the first auxiliary electrode 190, and may have the same thickness as that of the first anode electrode 180 and/or the first auxiliary electrode 190. In some embodiments, the first pad electrode 400 and the first anode electrode 180 and/or the first auxiliary electrode 190 may be pattern-formed through the same mask process. The first pad electrode 400 may include a first lower pad electrode 401, a first upper pad electrode 402, and a first cover pad electrode 403.

The first lower pad electrode 401 may be formed to cover a top of the upper signal pad 302 through the sixth contact hole CH6, thereby preventing the upper signal pad 302 from being corroded. To this end, an oxidation rate of the first lower pad electrode 401 may be lower than that of the upper signal pad 302. That is, the first lower pad electrode 401 may be formed of a material having a stronger corrosion resistance than a material forming the upper signal pad 302. As described above, the first lower pad electrode 401 may prevent the top of the upper signal pad 302 from being corroded. Thus, the signal pad 300 may be formed in the above-described two-layer structure. The first lower pad electrode 401 may be formed of an alloy (MoTi) of molybdenum (Mo) and titanium (Ti), which may be similar to the above-described material of the first lower anode electrode 181 and/or the first lower auxiliary electrode 191, but embodiments are not limited thereto. The first lower pad electrode 401 may be formed of the same material as that of the first lower anode electrode 181 and/or the first lower auxiliary electrode 191, and may have the same thickness as that of the first lower anode electrode 181 and/or the first lower auxiliary electrode 191. For example, the first lower pad electrode 401 and the first lower anode electrode 181; the first lower pad electrode 401 and the first lower auxiliary electrode 191; or the first lower pad electrode 401, the first lower anode electrode 181, and the first lower auxiliary electrode 191 may be pattern-formed through the same mask process.

The first upper pad electrode 402 may be formed between the first lower pad electrode 401 and the first cover pad electrode 403. The first upper pad electrode 402 may be formed of copper (Cu), which is a metal having a low resistance, but embodiments are not limited thereto. The first upper pad electrode 402 may be formed of a metal that is relatively lower in resistance than the first lower pad electrode 401 and the first cover pad electrode 403. To lower a total resistance of the first pad electrode 400, the first upper pad electrode 402 may be thicker than each of the first lower pad electrode 401 and the first cover pad electrode 403. The first upper pad electrode 402 may be formed of the same material as that of the first upper anode electrode 182 and/or the first upper auxiliary electrode 192 to have the same thickness as that of the first upper anode electrode 182 and/or the first upper auxiliary electrode 192. For example, the first upper pad electrode 402 and the first upper anode electrode 182; the first upper pad electrode 402 and the first upper auxiliary electrode 192; or the first upper pad electrode 402, the first upper anode electrode 182, and the first upper auxiliary electrode 192 may be pattern-formed through the same mask process.

The first cover pad electrode 403 may be formed on the first upper pad electrode 402. The first cover pad electrode 403 may be formed to cover a top and a side surface of the first upper pad electrode 402, thereby preventing the first upper pad electrode 402 from being corroded. That is, the first cover pad electrode 403 may prevent the first upper pad electrode 402 from being exposed to the outside. An oxidation rate of the first cover pad electrode 403 may be lower than that of the first upper pad electrode 402. That is, the first cover pad electrode 403 may be formed of a material having a stronger corrosion resistance than a material forming the first upper pad electrode 402.

The first cover pad electrode 403 may cover up to a side surface of the first lower pad electrode 401. An oxidation rate of the first cover pad electrode 403 may be lower than that of the first lower pad electrode 401. That is, the first cover pad electrode 403 may be formed of a material having a stronger corrosion resistance than a material forming the first lower pad electrode 401. The first cover pad electrode 403 may be formed of a transparent conductive material, such as ITO or the like, but embodiments are not limited thereto. The first cover pad electrode 403 may be formed of the same material as that of the first cover anode electrode 183 and/or the first cover auxiliary electrode 193, and may have the same thickness as that of the first cover anode electrode 183 and/or the first cover auxiliary electrode 193. For example, the first cover pad electrode 403 and the first cover anode electrode 183; the first cover pad electrode 403 and the first cover auxiliary electrode 193; or the first cover pad electrode 403, the first cover anode electrode 183, and the first cover auxiliary electrode 193 may be pattern-formed through the same mask process.

Figure 3:
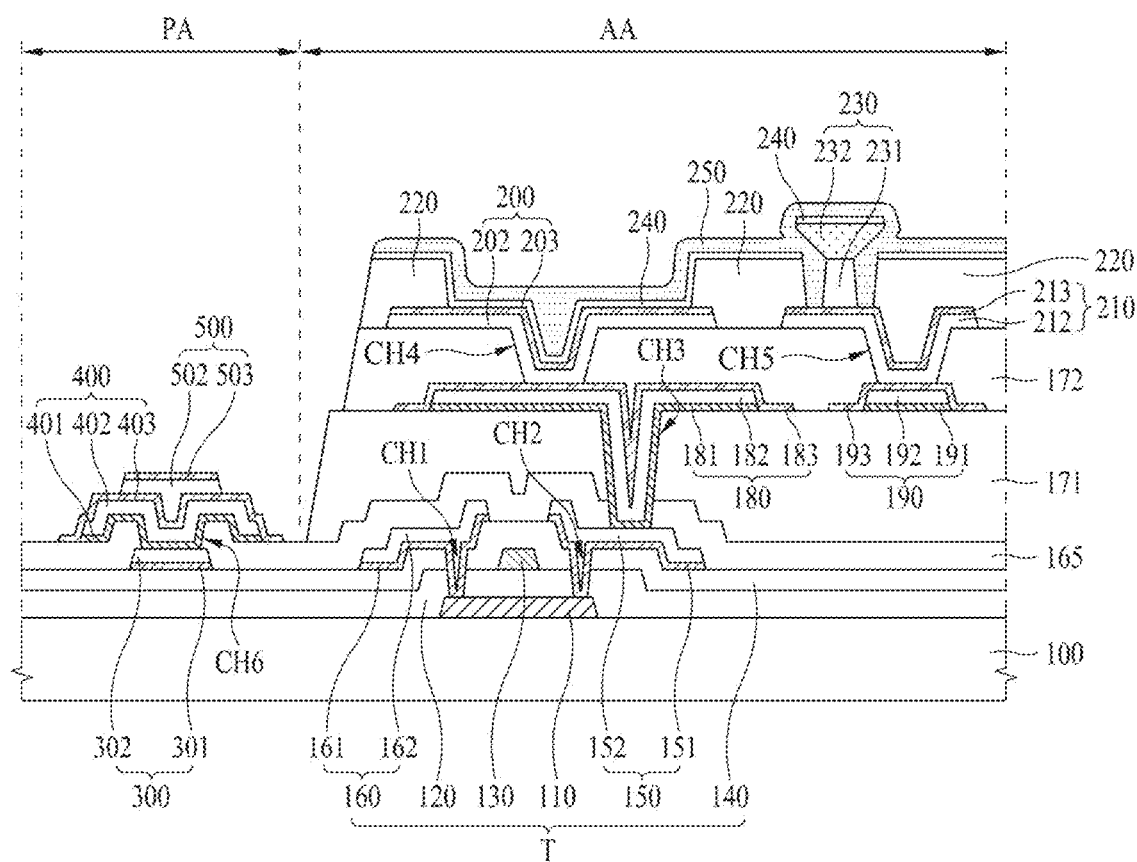
FIG. 3 is a cross-sectional view of an organic light-emitting display apparatus according to an example embodiment of the present disclosure.

FIG. 3 is a cross-sectional view of an organic light-emitting display apparatus according to an example embodiment of the present disclosure. The organic light-emitting display apparatus of FIG. 3 is the similar to the above-described organic light-emitting display apparatus of FIG. 2, except that structures of a second anode electrode 200 and a second auxiliary electrode 210 are changed and a second pad electrode 500 is further provided. Thus, like reference numerals refer to like elements. Hereinafter, elements different from the above-described elements of FIG. 2 will be described in detail.

As shown in FIG. 3, according to an embodiment of the present disclosure, the second anode electrode 200 may include a second center anode electrode 202 and a second upper anode electrode 203, and the second lower anode electrode 201 of the FIG. 2 example may be omitted. Also, the second auxiliary electrode 210 may include a second center auxiliary electrode 212 and a second upper auxiliary electrode 213, and the second lower auxiliary electrode 211 of the FIG. 2 example may omitted.

In such a structure, the second center anode electrode 202 and the second center auxiliary electrode 212 may be formed of a material, such as an alloy (MoTi) of molybdenum (Mo) and titanium (Ti), which are good in reflectivity and are good in corrosion resistance, but embodiments are not limited thereto.

According to an embodiment of the present disclosure, the second pad electrode 500 may be further formed on the first pad electrode 400. Because the second pad electrode 500 is further provided, a height of a pad part may increase, and a contact area may increase, whereby the second pad electrode 500 may be more easily connected to an external driver. The second pad electrode 500 may be formed of the same material as that of the second anode electrode 200 and/or the second auxiliary electrode 210 having a two-layer structure, and may have the same thickness as that of the second anode electrode 200 and/or the second auxiliary electrode 210. For example, the second pad electrode 500 and the second anode electrode 200; the second pad electrode 500 and the second auxiliary electrode 210; or the second pad electrode 500, the second anode electrode 200, and the second auxiliary electrode 210 may be pattern-formed through the same mask process.

The second pad electrode 500 may include a second center pad electrode 502 and a second upper pad electrode 503. The second center pad electrode 502 may be formed of the same material as that of the second center anode electrode 202 and/or the second center auxiliary electrode 212. The second upper pad electrode 503 may be formed of the same material as that of the second upper anode electrode 203 and/or the second upper auxiliary electrode 213.

According to an embodiment, a side surface of the second center pad electrode 502 may be exposed to the outside, but because the second center pad electrode 502 may be formed of a material which has good corrosion resistance, the second center pad electrode 502 may be prevented from being corroded. Also, the second upper pad electrode 503 may be exposed to the outside, but because the second upper pad electrode 503 may be formed of a material which is good in corrosion resistance, the second upper pad electrode 503 may be prevented from being corroded.

FIGS. 4A to 4K are cross-sectional views illustrating a method of manufacturing an organic light-emitting display apparatus according to an example embodiment of the present disclosure. The FIGS. 4A to 4K examples illustrate a method of manufacturing the above-described organic light-emitting display apparatus of the example of FIG. 2. Thus, like reference numerals refer to like elements, and in a material and a structure of each element, the same or similar descriptions may not be repeated.

Figure 4A:
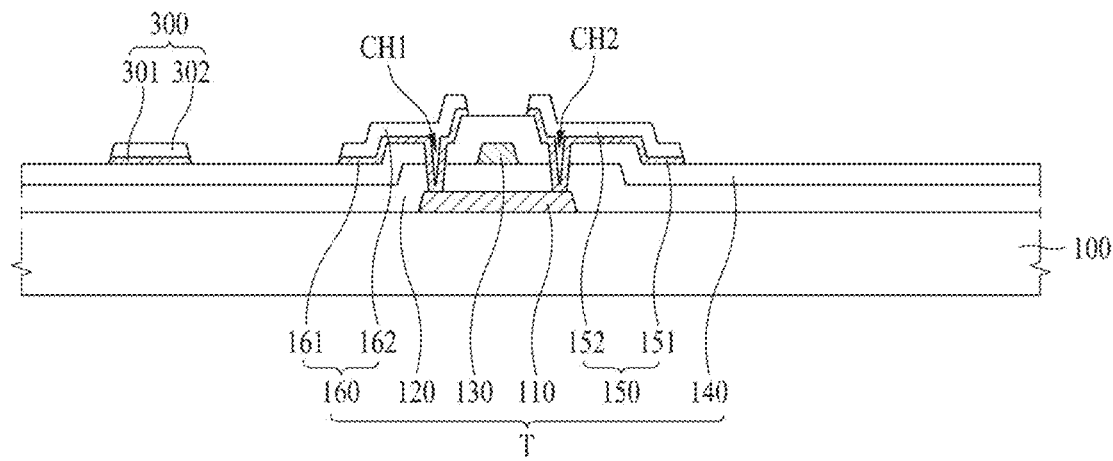
FIGS. 4A to 4K are cross-sectional views illustrating a method of manufacturing an organic light-emitting display apparatus according to an example embodiment of the present disclosure.

First, as shown in FIG. 4A, an active layer 110, a gate insulation layer 120, a gate electrode 130, an interlayer dielectric 140, a source electrode 150, a drain electrode 160, and a signal pad 300 may be sequentially formed on a substrate 100.

The active layer 110 may be formed on the substrate 100, the gate insulation layer 120 may be formed on the active layer 110, the gate electrode 130 may be formed on the gate insulation layer 120, the interlayer dielectric 140 may be formed on the gate electrode 130, and a first contact hole CH1 and a second contact hole CH2 may be formed in the gate insulation layer 120 and the interlayer dielectric 140. Subsequently, the drain electrode 160 (which may be connected to one end region of the active layer 110 through the first contact hole CH1), the source electrode 150 (which may be connected to the other end region of the active layer 110 through the second contact hole CH2), and the signal pad 300 may be formed.

Here, the active layer 110, the gate electrode 130, the source electrode 150, and the drain electrode 160 may be formed in an active area AA. The gate insulation layer 120 and the interlayer dielectric 140 may be formed to extend from the active area AA to a pad area PA. The signal pad 300 may be formed in the pad area AA. As such, a TFT T may be formed in the active area AA, and the signal pad 300 may be formed in the pad area PA.

The source electrode 150 may include a lower source electrode 151 and an upper source electrode 152. The drain electrode 160 may include a lower drain electrode 161 and an upper drain electrode 162. The signal pad 300 may include a lower signal pad 301 and an upper signal pad 302. The source electrode 150, the drain electrode 160, and the signal pad 300 may be formed simultaneously of the same material by the same patterning process.

Figure 4B:
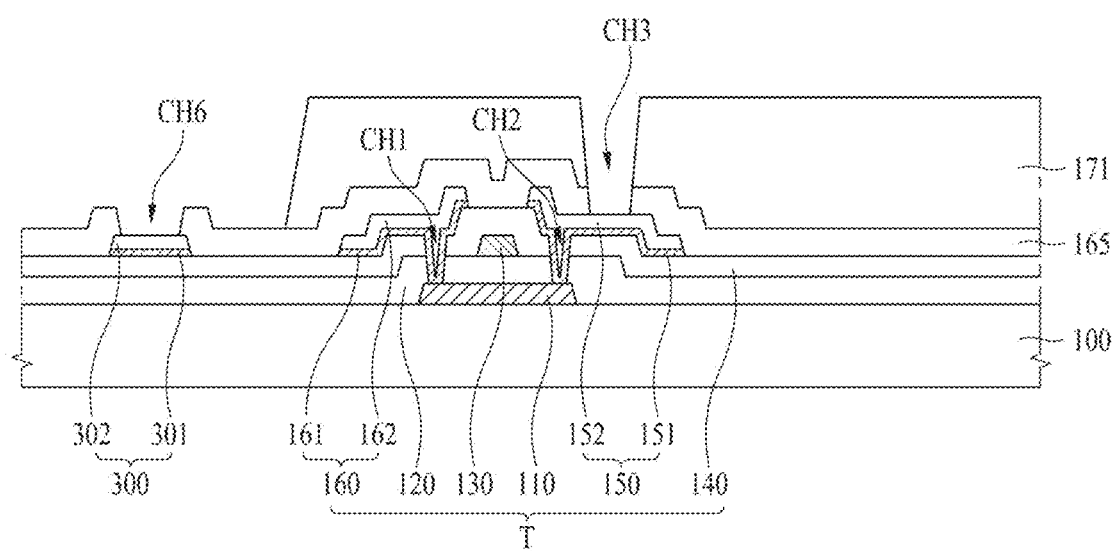

Subsequently, as shown in FIG. 4B, a passivation layer 165 may be formed on the source electrode 150, the drain electrode 160, and the signal pad 300; and a first planarization layer 171 may be formed on the passivation layer 165. The passivation layer 165 may be formed to extend from the active area AA to the pad area PA, and the first planarization layer 171 may be formed in the active area AA.

The passivation layer 165 and the first planarization layer 171 may be formed to include a third contact hole CH3 in the active area AA, and the source electrode 150 may be exposed to the outside through the third contact hole CH3. Also, the passivation layer 165 may be formed to include a sixth contact hole CH6 in the pad area PA, and the signal pad 300 may be exposed to the outside through the sixth contact hole CH6.

According to an embodiment of the present disclosure, the third contact hole CH3 for externally exposing the source electrode 150 and the sixth contact hole CH6 for externally exposing the signal pad 300 may be formed simultaneously. Thus, the third contact hole CH3 and the sixth contact hole CH6 may be formed through one mask process, thereby preventing the number of mask processes from increasing. Because the upper signal pad 302 exposed by the sixth contact hole CH6 may be vulnerable to corrosion, an etchant may not be brought in contact with the upper signal pad 302. According to an embodiment of the present disclosure, the exposed upper signal pad 302 may be covered by a lower pad electrode 401 in a process of FIG. 4C described below. Thus, the etchant may not be brought in contact with the upper signal pad 302. For the same reason, the sixth contact CH6 and the third contact hole CH3 may be simultaneously formed.

Figure 4C:
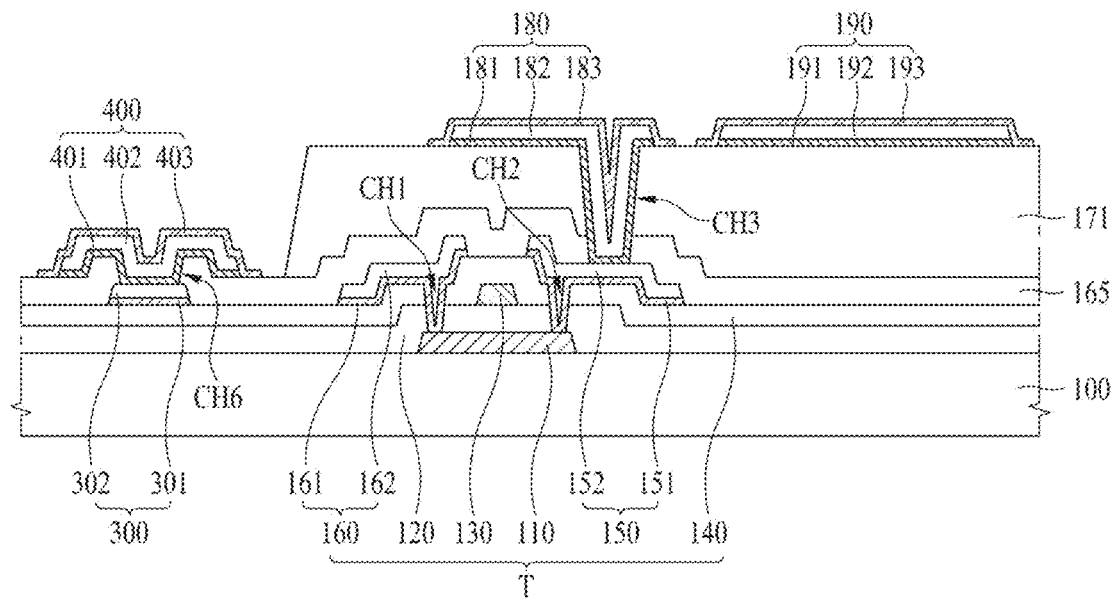

Subsequently, as shown in FIG. 4C, a first anode electrode 180 and a first auxiliary electrode 190 may be formed to be separated from each other on the first planarization layer 171 in the active area AA. A first pad electrode 400 may be formed on the passivation layer 165 in the pad area PA.

The first anode electrode 180 may be formed to be connected to the source electrode 150 through the third contact hole CH3. The first pad electrode 400 may be formed to be connected to the signal pad 300 through the sixth contact hole CH6. In some embodiments, the first anode electrode 180 may be formed to be connected to the drain electrode 160 through the third contact hole CH3 that is formed to expose the drain electrode 160.

The first anode electrode 180 may be configured with a first lower anode electrode 181, a first upper anode electrode 182, and a first cover anode electrode 183. The first auxiliary electrode 190 may be configured with a first lower auxiliary electrode 191, a first upper auxiliary electrode 192, and a first cover auxiliary electrode 193. The first pad electrode 400 may be configured with a first lower pad electrode 401, a first upper pad electrode 402, and a first cover pad electrode 403. The first anode electrode 180, the first auxiliary electrode 190, and the first pad electrode 400 may be simultaneously formed of the same material through the same patterning process.

Figure 4D:
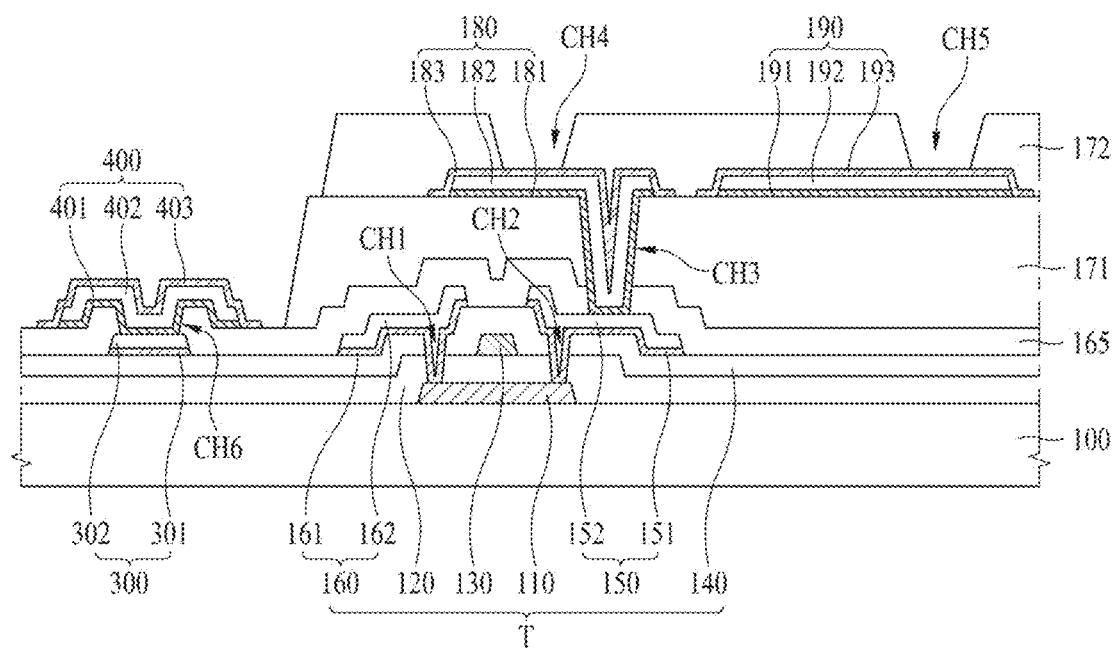

Subsequently, as shown in FIG. 4D, a second planarization layer 172 may be formed on a first anode electrode 180 and a first auxiliary electrode 190 in the active area AA. The second planarization layer 173 may be formed to include a fourth contact hole CH4 and a fifth contact hole CH5. The first anode electrode 180 may be exposed to the outside through the fourth contact hole CH4. The first auxiliary electrode 190 may be exposed to the outside through the fifth contact hole CH5.

Figure 4E:
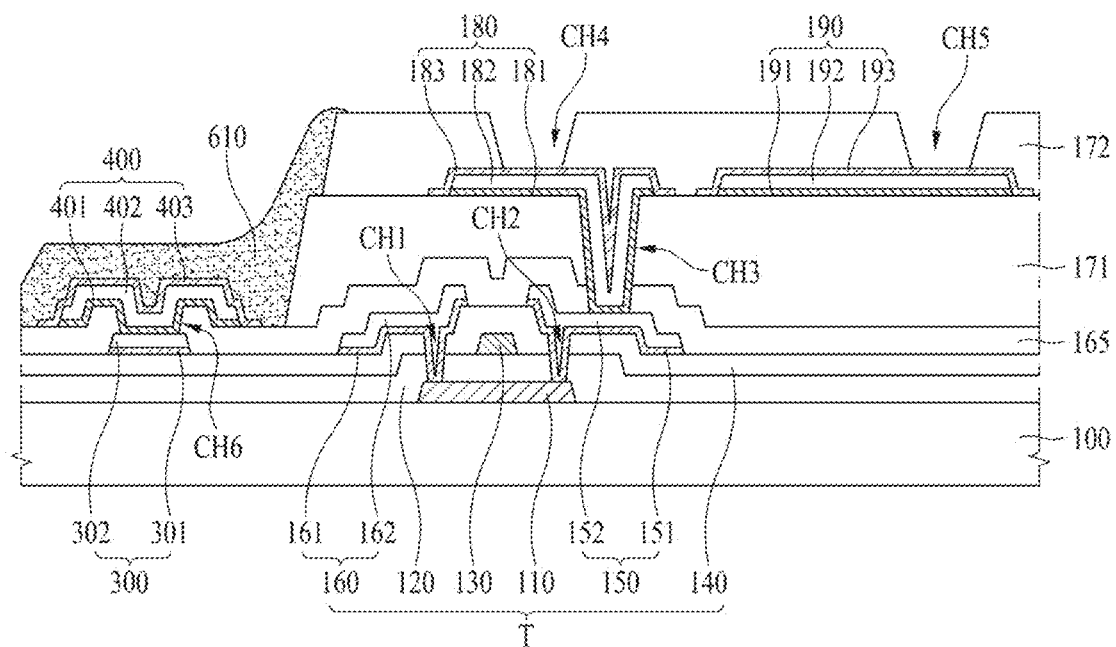

Subsequently, as shown in FIG. 4E, the first photoresist pattern 610 may be formed on the first pad electrode 400 in the pad area PA. The first pad electrode 400 may be covered by the first photoresist pattern 610, and thus may not be exposed to the outside. The first photoresist pattern 610 may not be formed in the active area AA.

Figure 4F:
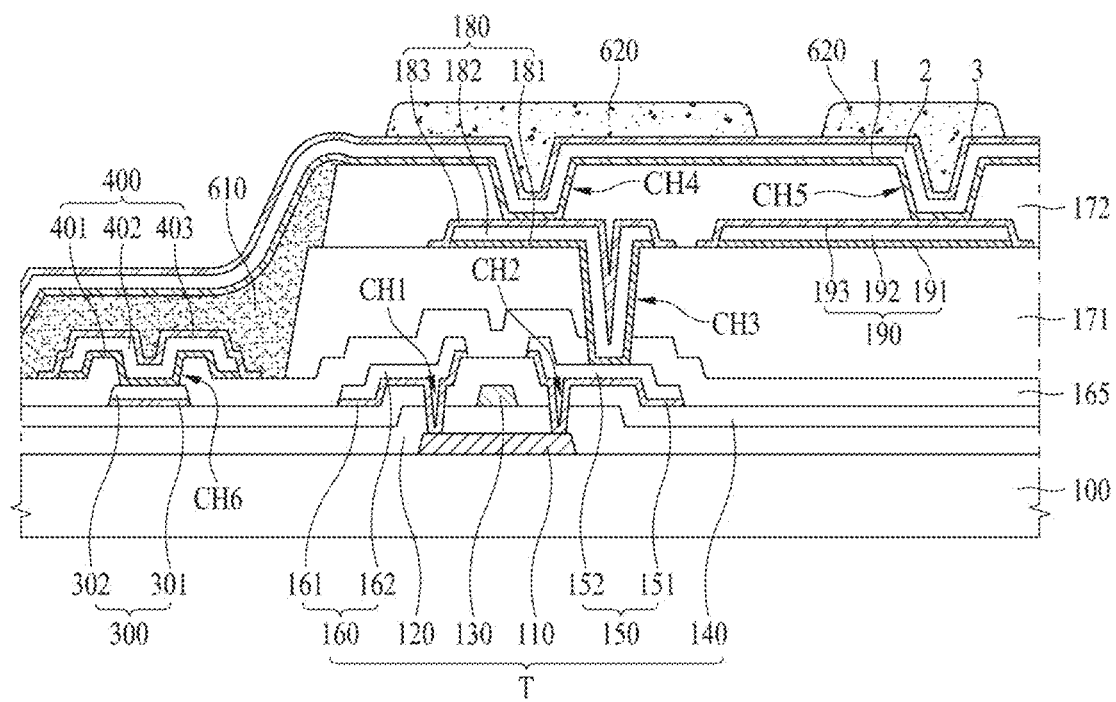

Subsequently, as shown in FIG. 4F, an electrode layer for a second anode electrode (labeled as 200 in FIG. 4G) and a second auxiliary electrode (labeled as 210 in FIG. 4G) may be formed in the pad area PA and the active area AA. In more detail, a lower electrode layer 1, an intermediate electrode layer 2, and an upper electrode layer 3 may be sequentially formed on the first photoresist pattern 610 in the pad area PA and the second planarization layer 172 in the active area AA. Also, a second photoresist pattern 620 may be formed on the electrode layer, e.g., the upper electrode layer 3 in the active area AA.

Figure 4G:
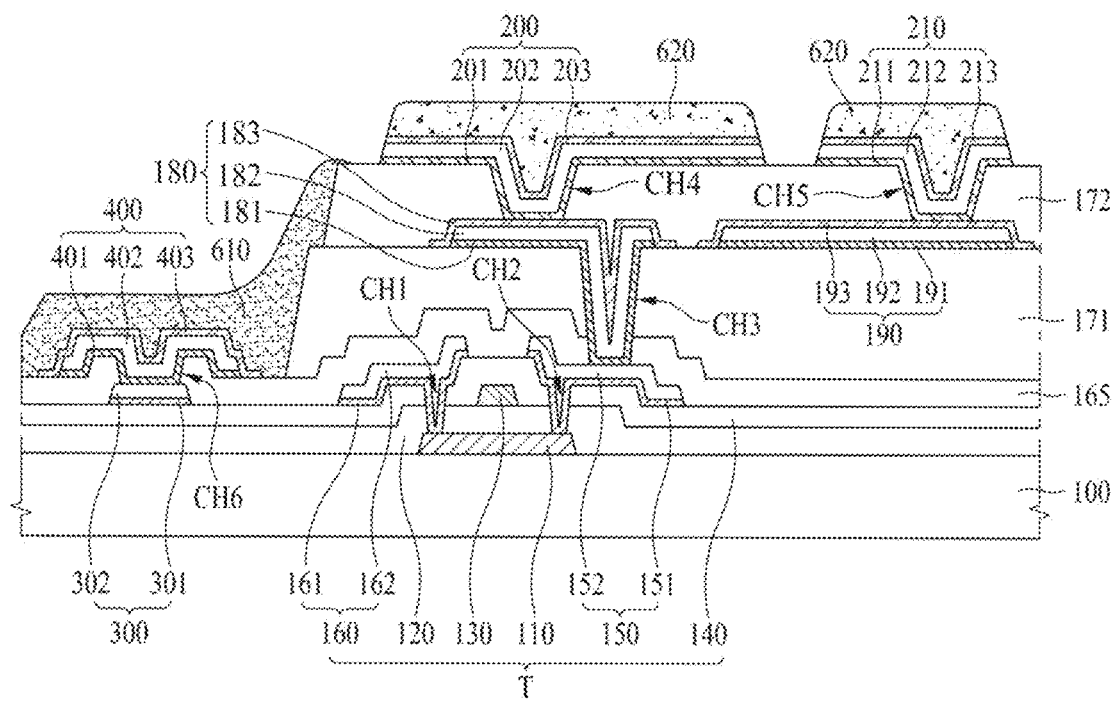

Subsequently, as shown in FIG. 4G, a second anode electrode 200 and a second auxiliary electrode 210 may be formed by etching the lower electrode layer 1, the intermediate electrode layer 2, and the upper electrode layer 3 with the second photoresist pattern 620 as a mask. That is, the second photoresist pattern 620 may be formed as a pattern corresponding to a pattern of each of the second anode electrode 200 and the second auxiliary electrode 210. Therefore, a portion of the lower electrode layer 1, a portion of the intermediate electrode layer 2, and a portion of the upper electrode layer 3 that are not covered by the second photoresist pattern 620 may be removed by the etching process, and portions covered by the second photoresist pattern 620 may remain, thereby forming the pattern of each of the second anode electrode 200 and the second auxiliary electrode 210. As a result, the second anode electrode 200 and the second auxiliary electrode 210 may be simultaneously formed of the same material through the same patterning process.

The second anode electrode 200 may include a second lower anode electrode 201, a second center anode electrode 202, and a second upper anode electrode 203. The second auxiliary electrode 210 may include a second lower auxiliary electrode 211, a second center auxiliary electrode 212, and a second upper auxiliary electrode 213.

When the portion of the lower electrode layer 1, the portion of the intermediate electrode layer 2, and the portion of the upper electrode layer 3 that are not covered by the second photoresist pattern 620 are removed by the etching process, the first pad electrode 400 may not be damaged by an etchant because the first photoresist pattern 610 covers the first pad electrode 400.

Figure 4H:
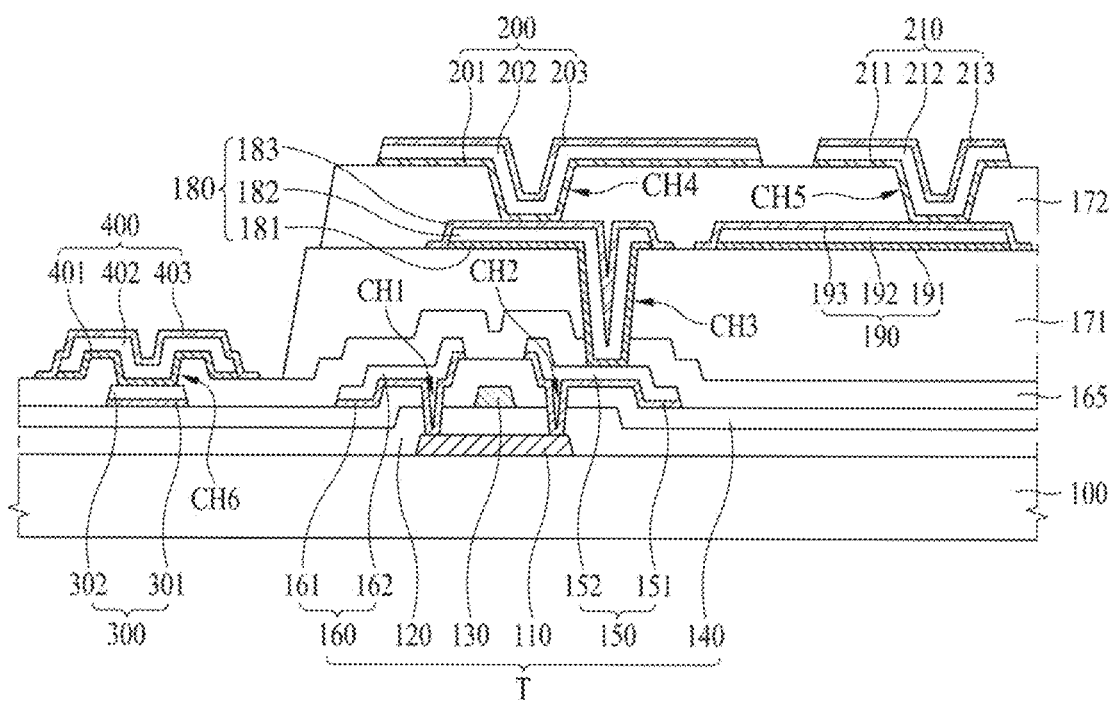

Subsequently, as shown in FIG. 4H, the first photoresist pattern 610 and the second photoresist pattern 620 may be removed by a strip process. Therefore, the pad electrode 400, the second anode electrode 200, and the second auxiliary electrode 210 may be exposed to the outside.

FIGS. 4E to 4H illustrate to a method of forming the second anode electrode 200 and the second auxiliary electrode 210 without the first pad electrode 400 being damaged. According to an embodiment of the present disclosure, the first photoresist pattern 610 may be formed on the first pad electrode 400 to cover the first pad electrode 400. Thus, the first pad electrode 400 may not be damaged by an etchant in forming the pattern of each of the second anode electrode 200 and the second auxiliary electrode 210. Also, because the first photoresist pattern 610 may be removed simultaneously with the second photoresist pattern 620, a manufacturing process may be simplified.

Instead of using the first photoresist pattern 610, the second planarization layer 172 may be formed to cover the first pad electrode 400 by extending the second planarization layer 172 to the pad area PA. Then, the second anode electrode 200 and the second auxiliary electrode 210 may be formed, in the above-described process of FIG. 4D. However, in one example, a process of removing a region of the second planarization layer 172 extending to the pad area PA through an oxygen ($O_2$) ashing process may be further performed after the second anode electrode 200 and the second auxiliary electrode 210 are formed to externally expose the first pad electrode 400. For example, a photoresist pattern may be further formed as a mask for the process of removing the region of the second planarization layer 172 extending to the pad area PA. Moreover, due to the oxygen ($O_2$) ashing process, the inside of a chamber may be contaminated, and a process time may increase. Therefore, as described above with reference to the examples of FIGS. 4E to 4H, the first photoresist pattern 610 may be used.

Figure 4I:
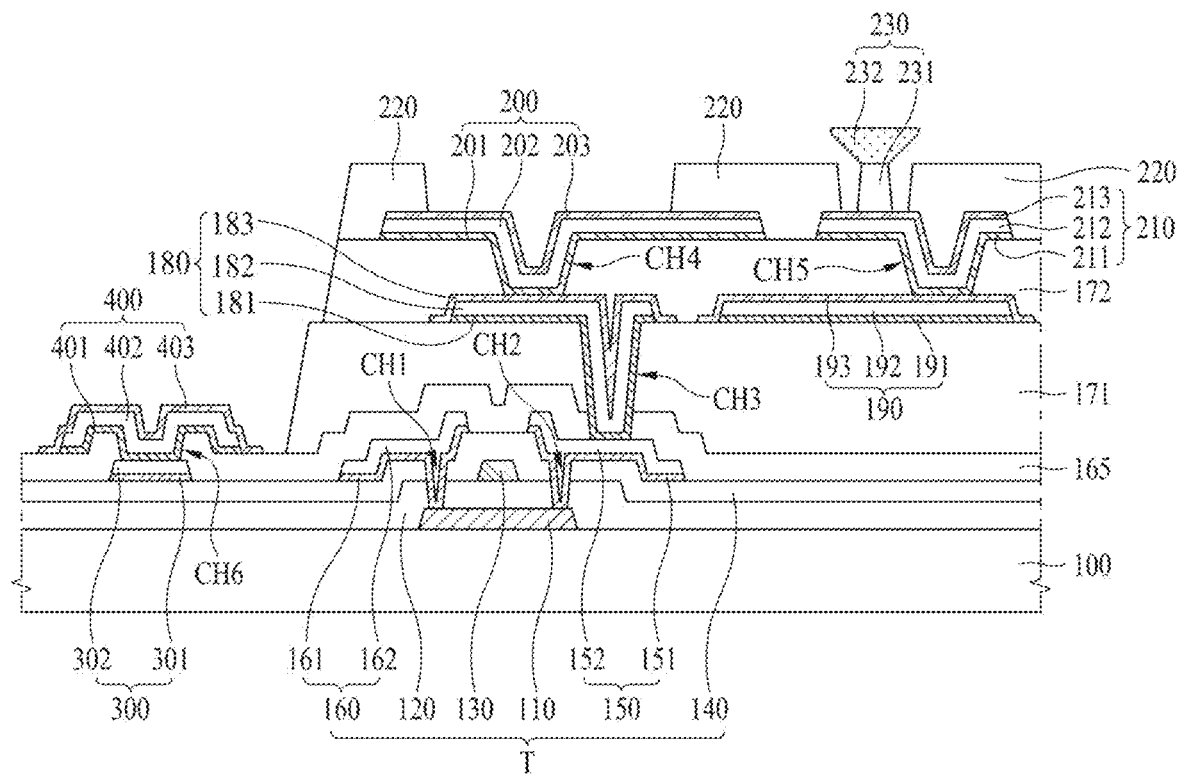

Subsequently, as shown in FIG. 4I, a bank 220 may be formed on both sides of the second anode electrode 200 to expose a top of the second anode electrode 200. Also, the bank 220 may be formed on both sides of the second auxiliary electrode 210 to expose a top of the second auxiliary electrode 210.

Moreover, a first partition wall 231 and a second partition wall 232 may be sequentially formed on the exposed top of the second auxiliary electrode 210. The first partition wall 231 may be formed of the same material as that of the bank 220, which may be through the same pattern forming process as that of the bank 220, and may be formed simultaneously with the bank 220. The partition wall 230 may be formed to be separated from the bank 220 by a certain (e.g., predetermined) distance. Thus, a separation space may be provided between the partition wall 230 and the bank 220.

For a top of the partition wall 230 to act as eaves, a width of a top of the second partition wall 232 may be formed greater than that of a bottom of the second partition wall 232. For example, with respect to a front view of the organic light-emitting display apparatus, the top of the second partition wall 232 may cover the separation space between the partition wall 230 and the bank 220. Thus, in a below-described process of depositing an organic emission layer 240, the organic emission layer 240 may not be deposited in the separation space between the partition wall 230 and the bank 220.

Figure 4J:
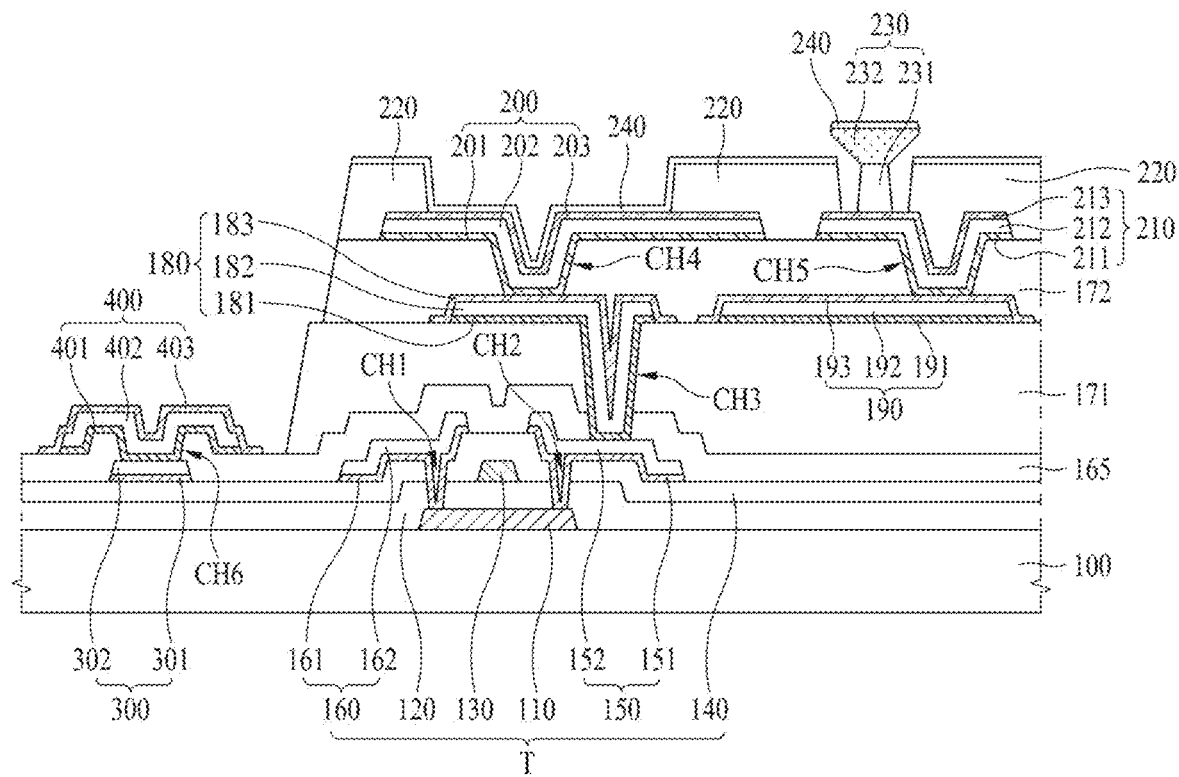

Subsequently, as shown in FIG. 4J, the organic emission layer 240 may be formed on the second anode electrode 200. The organic emission layer 240 may be formed by a deposition process, such as an evaporation process, which may be excellent in terms of accuracy and straightness of deposition of a deposited material. However, embodiments are not limited thereto. Thus, the organic emission layer 240 may be deposited on top of the bank 220 and the partition wall 230, but the organic emission layer 240 may not be deposited in the separation space between the partition wall 230 and the bank 220. That is, the top of the partition wall 230 may act as the eaves in depositing the organic emission layer 240. Thus, even when the organic emission layer 240 is deposited without a mask pattern that covers the top of the second auxiliary electrode 210, the organic emission layer 240 may not be deposited in the separation space between the partition wall 230 and the bank 220.

Figure 4K:
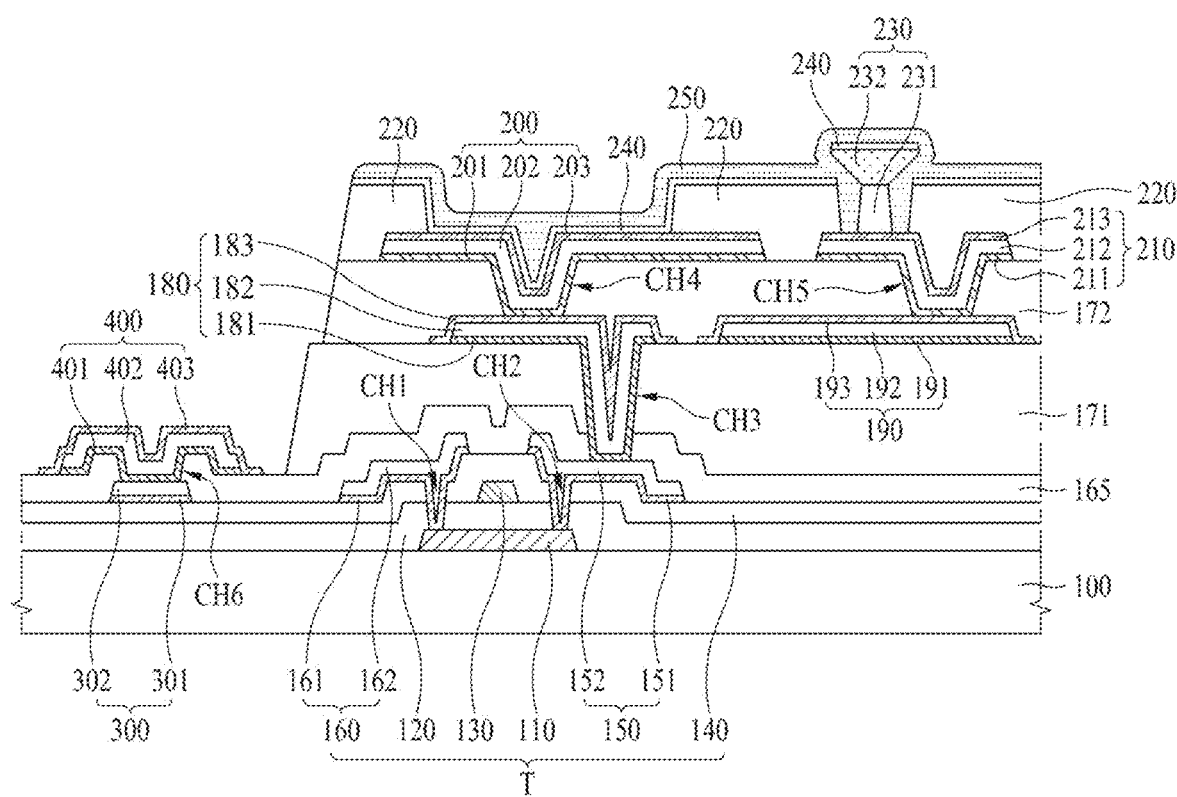

Subsequently, as shown in FIG. 4K, a cathode electrode 250 may be formed on the organic emission layer 240. The cathode electrode 250 may be formed to be connected to the second auxiliary electrode 210 through the separation space between the partition wall 230 and the bank 220. The cathode electrode 250 may be formed by a deposition process, which may not be as accurate or provide as much straightness of deposition of a deposited material. However, embodiments are not limited thereto. Thus, the cathode electrode 250 may be deposited in the separation space between the partition wall 230 and the bank 220 in a process of depositing the cathode electrode 250.

FIGS. 5A to 5H are cross-sectional views illustrating a method of manufacturing an organic light-emitting display apparatus according to an example embodiment of the present disclosure. FIGS. 5A to 5H illustrate examples of a method of manufacturing the above-described organic light-emitting display apparatus of FIG. 3. Thus, like reference numerals refer to like elements, and in a material and a structure of each element, the same or similar descriptions may not be repeated.

Figure 5A:
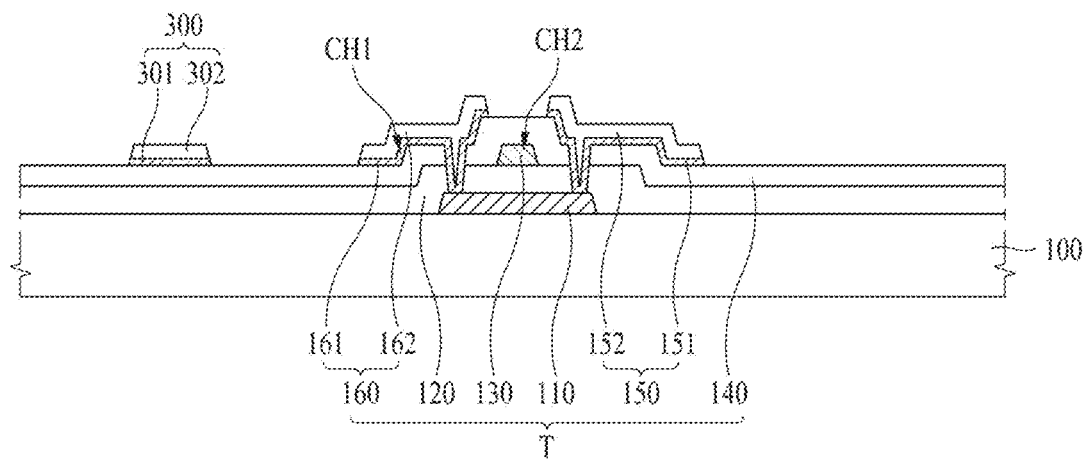
FIGS. 5A to 5H are cross-sectional views illustrating a method of manufacturing an organic light-emitting display apparatus according to an example embodiment of the present disclosure.

First, as shown in FIG. 5A, an active layer 110, a gate insulation layer 120, a gate electrode 130, an interlayer dielectric 140, a source electrode 150, a drain electrode 160, and a signal pad 300 may be sequentially formed on a substrate 100. Therefore, a TFT T may be formed in the active area AA, and the signal pad 300 may be formed in the pad area PA. Such a process is similar to the above-described process of FIG. 4A.

Figure 5B:
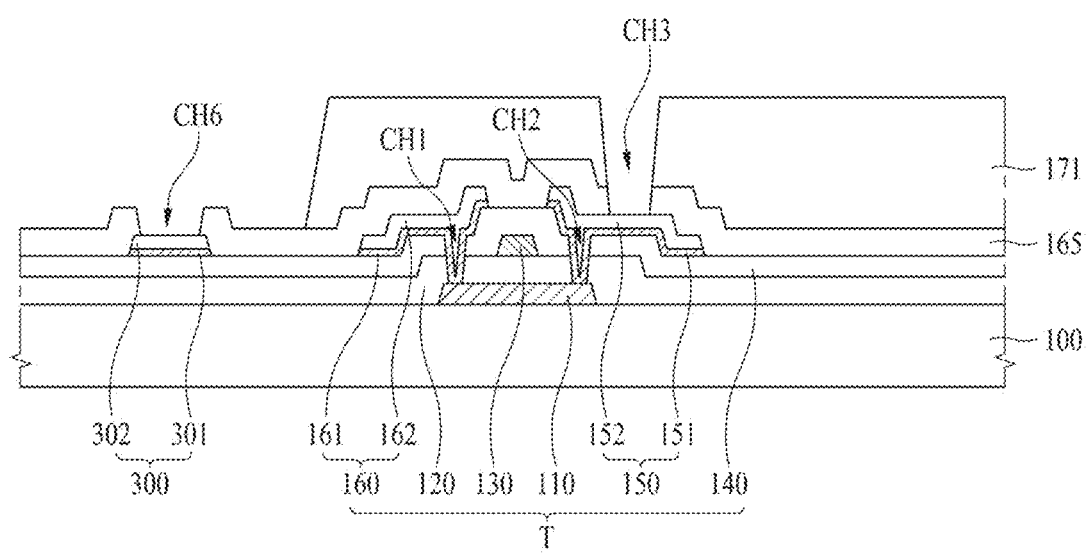

Subsequently, as shown in FIG. 5B, a passivation layer 165 may be formed on the source electrode 150, the drain electrode 160, and the signal pad 300. A first planarization layer 171 may be formed on the passivation layer 165. The passivation layer 165 and the first planarization layer 171 may be formed to include a third contact hole CH3 in the active area AA. The source electrode 150 may be exposed to the outside through the third contact hole CH3. Also, the passivation layer 165 may be formed to include a sixth contact hole CH6 in the pad area PA, and the signal pad 300 may be exposed to the outside through the sixth contact hole CH6. Such a process is similar to the above-described process of FIG. 4B.

Figure 5C:
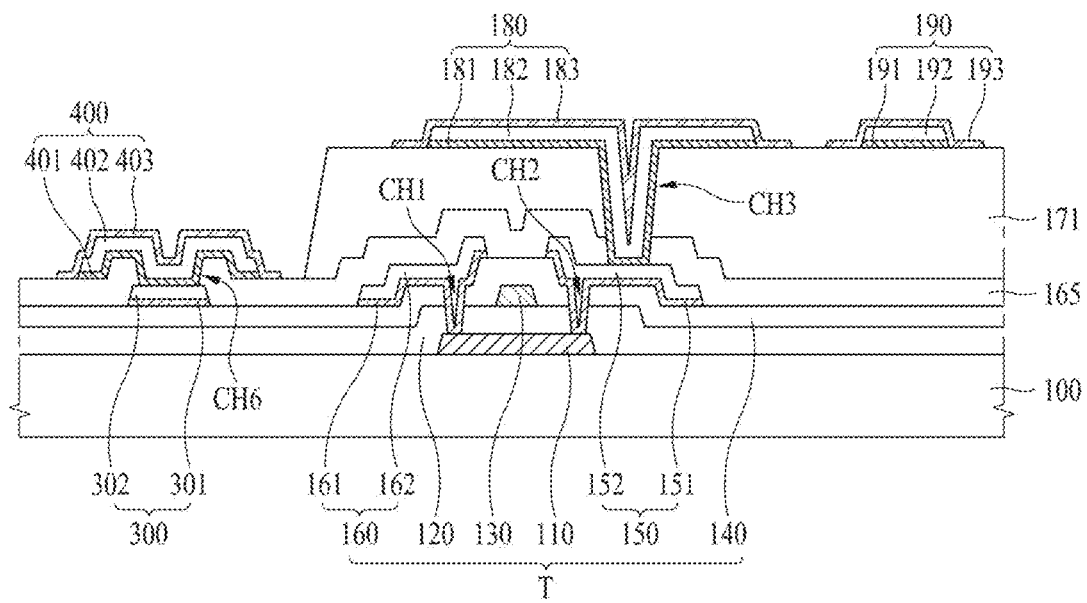

Subsequently, as shown in FIG. 5C, a first anode electrode 180 and a first auxiliary electrode 190 may be formed on the first planarization layer 171 in the active area AA, and a first pad electrode 400 may be formed on the passivation layer 165 in the pad area PA. The first anode electrode 180 may be formed to be connected to the source electrode 150 through the third contact hole CH3, and the first pad electrode 400 may be formed to be connected to the signal pad 300 through the sixth contact hole CH6. Such a process is similar to the above-described process of FIG. 4C.

Figure 5D:
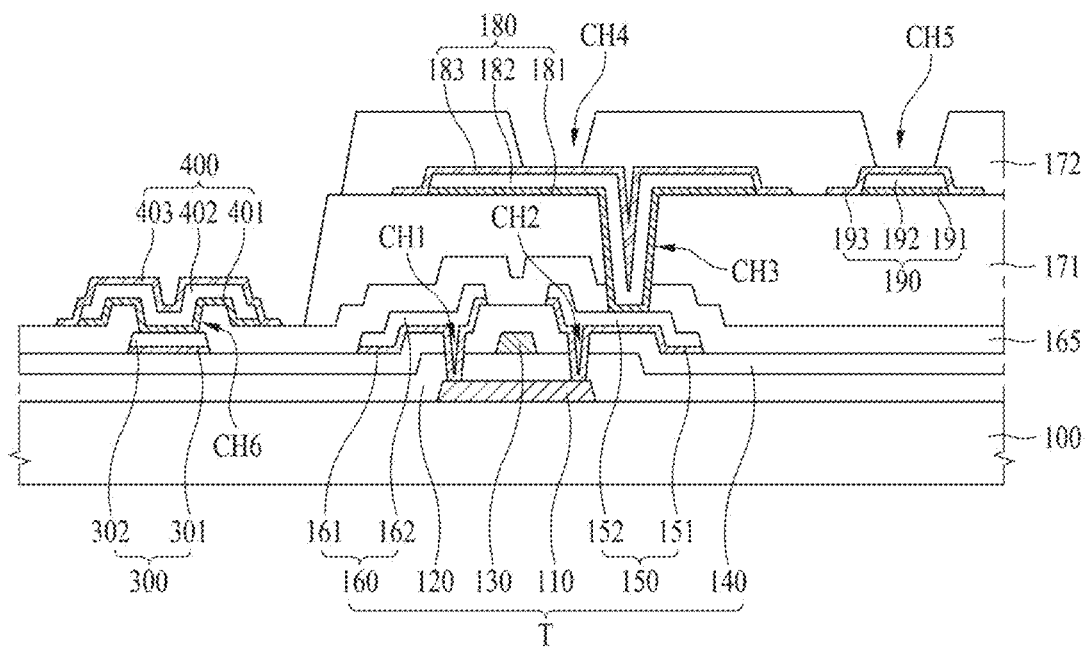

Subsequently, as shown in FIG. 5D, a second planarization layer 172 may be formed on the first anode electrode 180 and the first auxiliary electrode 190 in the active area AA. The second planarization layer 173 may be formed to include a fourth contact hole CH4 and a fifth contact hole CH5, the first anode electrode 180 may be exposed to the outside through the fourth contact hole CH4, and the first auxiliary electrode 190 may be exposed to the outside through the fifth contact hole CH5. Such a process is similar to the above-described process of FIG. 4D.

Figure 5E:
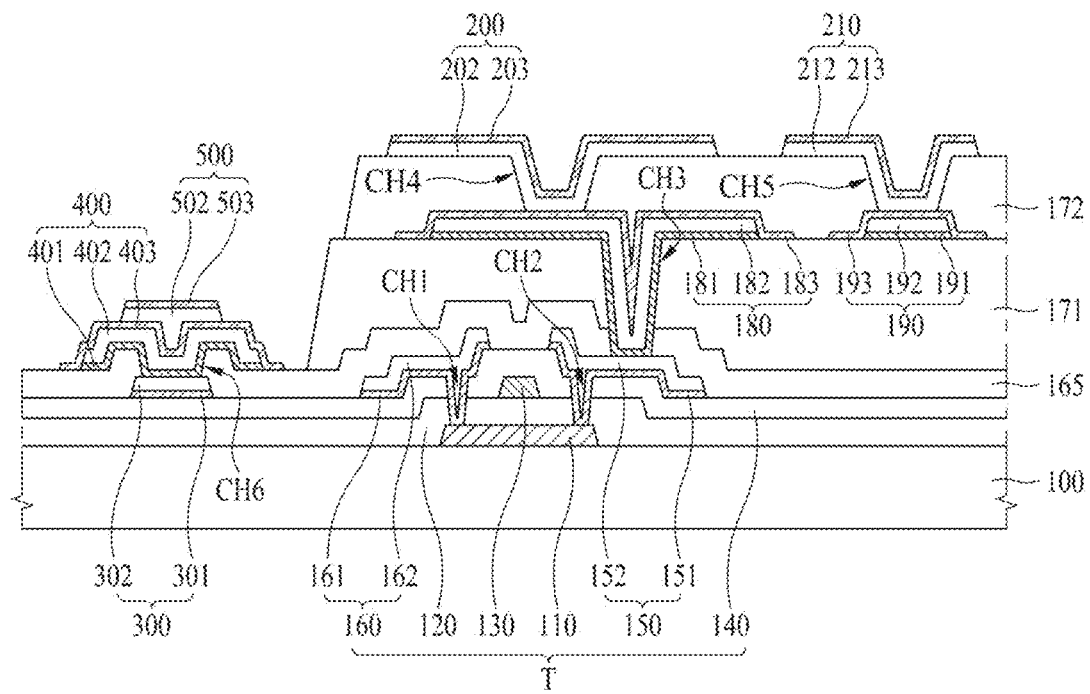

Subsequently, as shown in FIG. 5E, a second anode electrode 200 and a second auxiliary electrode 210 may be formed on the second planarization layer 172 in the active area AA, and a second pad electrode 500 may be formed on the first pad electrode 400 in the pad area PA. The second anode electrode 200 may be connected to the first anode electrode 180 through the fourth contact hole CH4, the second auxiliary electrode 210 may be connected to the second anode electrode 190 through the fifth contact hole CH5, and the second pad electrode 500 may be formed directly on a top of the first pad electrode 400.

The second anode electrode 200 may include a second center anode electrode 202 and a second upper anode electrode 203. The second auxiliary electrode 210 may include a second center auxiliary electrode 212 and a second upper auxiliary electrode 213. The second pad electrode 500 may include a second center pad electrode 502 and a second upper pad electrode 503. The second anode electrode 200, the second auxiliary electrode 210, and the second pad electrode 500 may be simultaneously formed of the same material through the same patterning process. Thus, an additional mask process is not necessary.

A first cover pad electrode 403 formed on an uppermost surface of the first pad electrode 400 may be formed of the same material (for example, ITO, which has good corrosion resistance) as that of the second upper pad electrode 503 formed on an uppermost surface of the second pad electrode 500. For example, when the second pad electrode 500 is pattern-formed, it may be desirable to prevent a pattern of the first cover pad electrode 403 from being damaged. As such, the second pad electrode 500 may be formed through a process in which an electrode material for the second center pad electrode 502 and an electrode material for the second upper pad electrode 503 may be sequentially deposited, the second upper pad electrode 503 may be pattern-formed by etching the electrode material for the second center pad electrode 502, and the second center pad electrode 502 may be subsequently pattern-formed by etching the electrode material for the second upper pad electrode 503. That is, the first cover pad electrode 403 may be covered by the electrode material for the second center pad electrode 502 when etching the electrode material for the second upper pad electrode 503. Thus, an etchant for etching the electrode material for the second upper pad electrode 503 may not be brought into contact with the first cover pad electrode 403, thereby preventing a pattern of the first upper pad electrode 403 from being damaged.

Figure 5F:
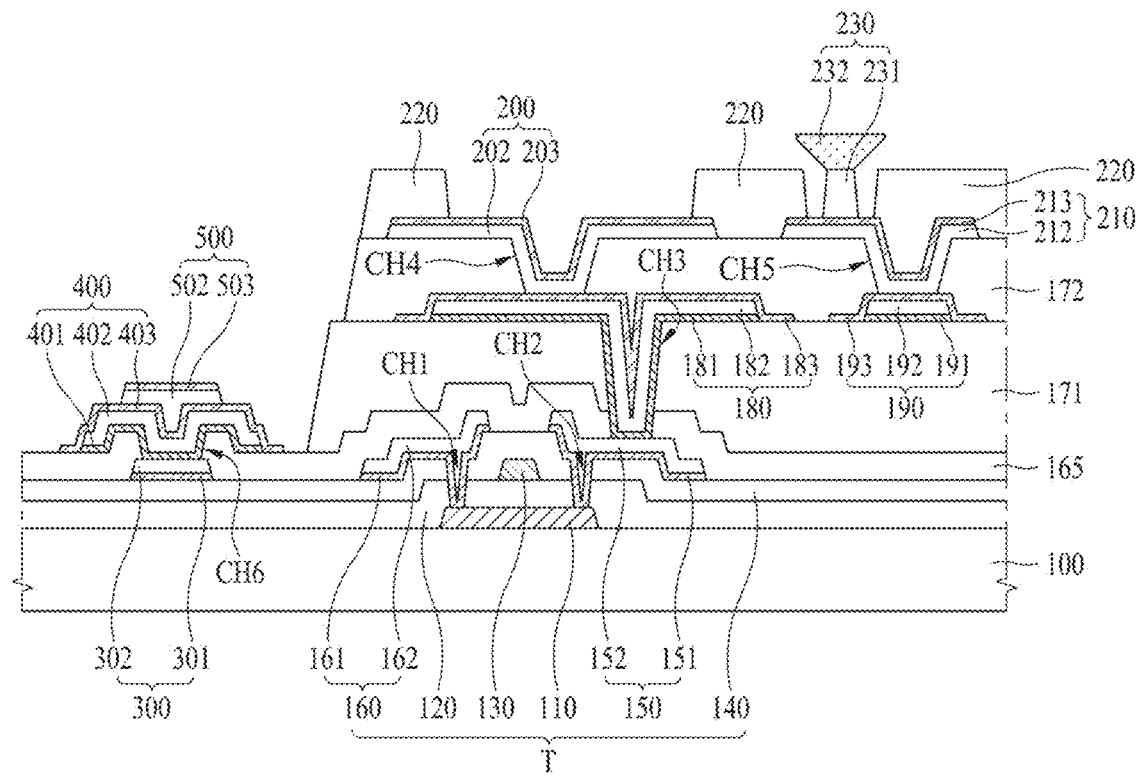

Subsequently, as shown in FIG. 5F, a bank 220 may be formed on both sides of the second anode electrode 200 to expose a top of the second anode electrode 200. Also, the bank 220 may be formed on both sides of the second auxiliary electrode 210 to expose a top of the second auxiliary electrode 210. Also, a first partition wall 231 and a second partition wall 232 may be sequentially formed on the exposed top of the second auxiliary electrode 210. The partition wall 230 may be formed to be separated from the bank 220 by a certain (e.g., a predetermined) distance. Thus, a separation space may be provided between the partition wall 230 and the bank 220. Such a process is similar to the above-described process of FIG. 4I.

Figure 5G:
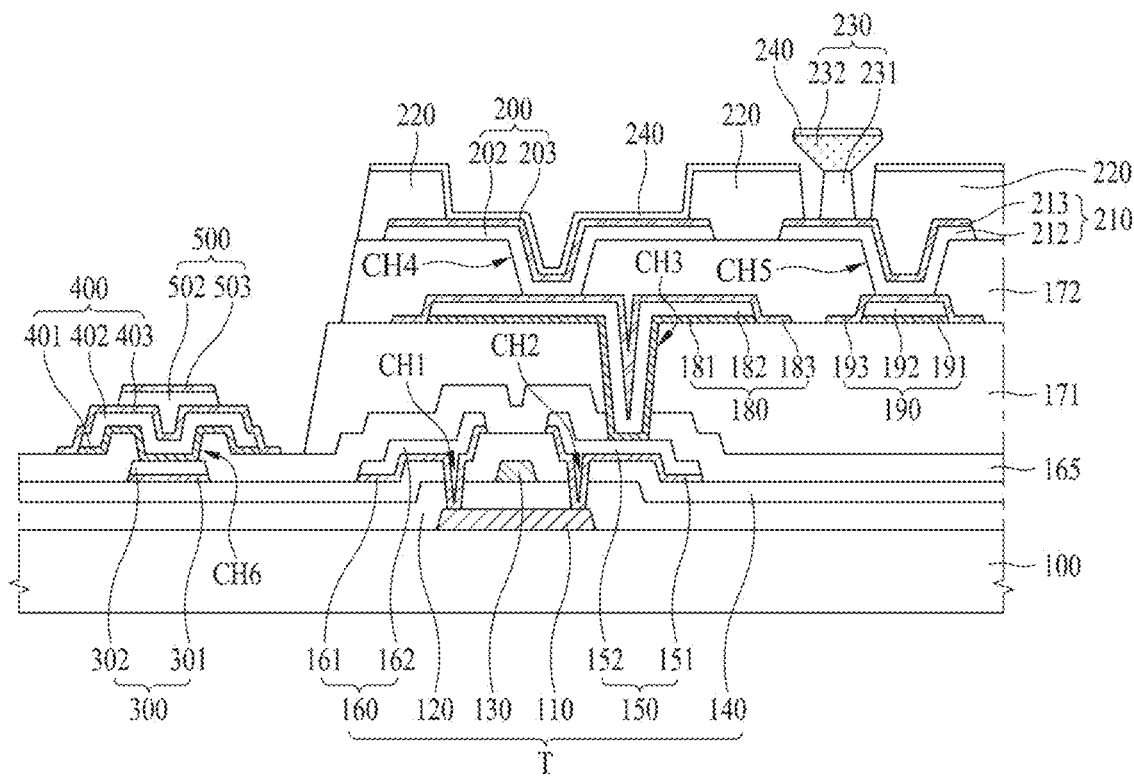

Subsequently, as shown in FIG. 5G, an organic emission layer 240 may be formed on the second anode electrode 200. The organic emission layer 240 may be deposited on top of the bank 220 and the partition wall 230, but is not deposited in the separation space between the partition wall 230 and the bank 220. Such a process is similar to the above-described process of FIG. 4J.

Figure 5H:
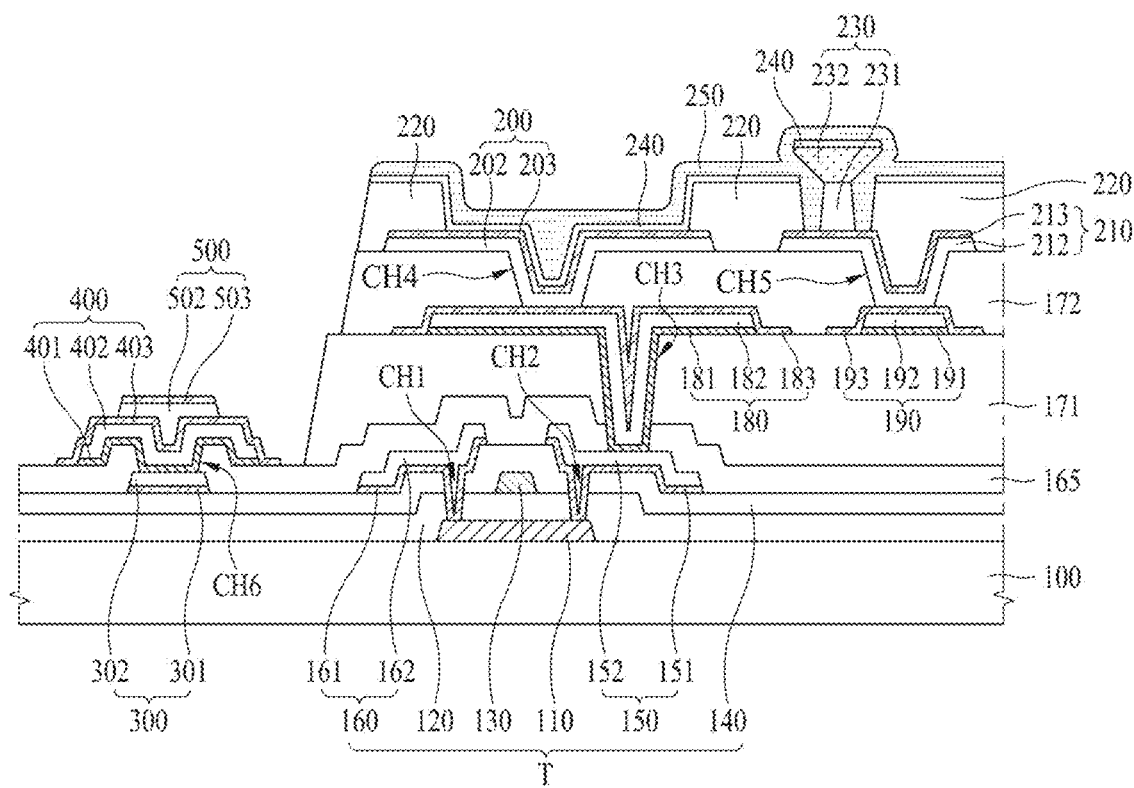

Subsequently, as shown in FIG. 5H, a cathode electrode 250 may be formed on the organic emission layer 240. The cathode electrode 250 may be formed to be connected to the second auxiliary electrode 210 through the separation space between the partition wall 230 and the bank 220. Such a process is similar to the above-described process of FIG. 4K.

According to embodiments of the present disclosure, the first pad electrode may be formed to cover the top of the signal pad, thereby preventing the signal pad from being corroded. Accordingly, the signal pad may be formed in a two-layer structure which may include the lower signal pad and the upper signal pad vulnerable to corrosion. For example, because the first pad electrode and the first auxiliary electrode may be simultaneously formed of the same material, the number of mask processes may not increase. Moreover, according to embodiments of the present disclosure, the contact hole for externally exposing the source electrode and the contact hole for externally exposing the signal pad may be simultaneously formed. Thus, the number of mask processes may not increase.

Moreover, according to embodiments of the present disclosure, the two auxiliary electrodes (for example, the first and second auxiliary electrodes) may be formed for lowering the resistance of the cathode electrode. Thus, the desired resistance characteristic of the auxiliary electrode may be more easily adjusted. For example, the first auxiliary electrode connected to the second auxiliary electrode through the contact hole may be further formed under the second auxiliary electrode, and the resistance of the cathode electrode may be effectively lowered even without any reduction in a pixel area.

It will be apparent to those skilled in the art that various modifications and variations can be made in the present disclosure without departing from the spirit or scope of the invention. Thus, it is intended that embodiments of the present disclosure cover the modifications and variations of this invention provided they come within the scope of the appended claims and their equivalents.

What is claimed is:

1. An organic light-emitting display apparatus, comprising:
a substrate;
a thin film transistor on the substrate;
a first insulating layer on the thin film transistor; and a first electrode comprising:
  a first lower electrode;
  a first upper electrode; and
  a first cover electrode,
    wherein the first electrode is on the first insulating layer, and
    wherein the first electrode is connected to the thin film transistor;
a signal pad on the substrate;
a first pad electrode comprising:
  a first lower pad electrode;
  a first upper pad electrode; and
  a first cover pad electrode,
    wherein the first pad electrode is connected to the signal pad; and
a second pad electrode on the first pad electrode,
wherein the first cover electrode covers a top and a side portion of the first upper electrode,
wherein the first cover electrode covers a side portion of the first lower electrode,
wherein the first cover pad electrode covers a top and a side portion of the first upper pad electrode,
wherein the first cover pad electrode covers a side portion of the first lower pad electrode, and
wherein the second pad electrode covers a top portion of the first cover pad electrode.

2. The organic light-emitting display apparatus of claim 1, wherein the first cover electrode covers a portion of a top surface of the first insulating layer.

3. The organic light-emitting display apparatus of claim 1, wherein:
  an oxidation rate of the first cover electrode is lower than an oxidation rate of the first upper electrode; and
  an oxidation rate of the first cover electrode is lower than an oxidation rate of the first lower electrode.

4. The organic light-emitting display apparatus of claim 1, further comprising:
  a second insulating layer on the first electrode; and
  a second electrode on the second insulating layer, the second electrode being connected to the first electrode through a first contact hole in the second insulating layer.

5. The organic light-emitting display apparatus of claim 4, wherein the second electrode comprises:
  a second lower electrode;
  a second central electrode; and
  a second upper electrode.

6. The organic light-emitting display apparatus of claim 1, further comprising:
  a first auxiliary electrode on the first insulating layer, the first auxiliary electrode comprising:
    a first lower auxiliary electrode;
    a first upper auxiliary electrode; and
    a first cover auxiliary electrode,
  wherein the first cover auxiliary electrode covers a top and a side portion of the first upper auxiliary electrode, and
  wherein the first cover auxiliary electrode covers a side portion of the first lower auxiliary electrode.

7. The organic light-emitting display apparatus of claim 6, wherein a width of the first auxiliary electrode is greater than a width of the first electrode.

8. The organic light-emitting display apparatus of claim 6, wherein:
  the first lower auxiliary electrode comprises a same material as the first lower electrode;
  the first upper auxiliary electrode comprises a same material as the first upper electrode; and
  the first cover auxiliary electrode comprises a same material as the first cover electrode.

9. The organic light-emitting display apparatus of claim 6, wherein:
  the first cover auxiliary electrode covers a portion of a top surface of the first insulating layer;
  the first lower electrode is directly connected to the thin film transistor;
  the first upper electrode is provided in a same pattern as the first lower electrode;
  a first end of the first cover electrode extends toward a first end of the first cover auxiliary electrode on the first insulating layer;
  the first end of the first cover auxiliary electrode extends toward the first end of the first cover electrode on the first insulating layer; and
  a lateral surface of the first end of the first cover electrode faces a lateral surface of the first end of the first cover auxiliary electrode.

10. The organic light-emitting display apparatus of claim 6, further comprising a second auxiliary electrode on the second insulating layer, the second auxiliary electrode being connected to the first auxiliary electrode through a second contact hole in the second insulating layer.

11. The organic light-emitting display apparatus of claim 6, wherein:
  an oxidation rate of the first cover auxiliary electrode is lower than an oxidation rate of the first upper auxiliary electrode; and
  an oxidation rate of the first cover auxiliary electrode is lower than an oxidation rate of the first lower auxiliary electrode.

12. The organic light-emitting display apparatus of claim 1, wherein:
  the first pad electrode is connected to the signal pad through a third contact hole;
  the first pad electrode covers a top of the signal pad;
  the first insulating layer comprises:
    a passivation layer on the thin film transistor; and
    a planarization layer on the passivation layer;
  the first electrode is on the planarization layer;
  the first pad electrode is on the passivation layer; and
  the first pad electrode comprises a same material as the first electrode.

13. The organic light-emitting display apparatus of claim 12, wherein:
  the signal pad comprises:
    a lower signal pad; and
    an upper signal pad;
  an oxidation rate of the lower signal pad is lower than an oxidation rate of the upper signal pad;
  the first lower pad electrode comprises a same material as the first lower electrode;
  the first upper pad electrode comprises a same material as the first upper electrode; and
  the first cover pad electrode comprises a same material as the first cover electrode.

14. An organic light-emitting display apparatus, comprising:
  a substrate;
  a first insulating layer on the substrate;
  a first electrode on the first insulating layer;
  a first auxiliary electrode on the first insulating layer;
  a signal pad on the substrate;
  a first pad electrode comprising:

a first lower pad electrode; a first upper pad electrode; and
a first cover pad electrode,
  wherein the first pad electrode is connected to the signal pad; and
a second pad electrode on the first pad electrode,
wherein the first electrode comprises:
  a first lower electrode,
  a first upper electrode on the first lower electrode, and
  a first cover electrode on the first upper electrode,
wherein the first auxiliary electrode comprises:
  a first lower auxiliary electrode,
  a first upper auxiliary electrode on the first lower electrode, and
  a first cover auxiliary electrode on the first upper auxiliary electrode,
wherein at least one of the first cover electrode and the first cover auxiliary electrode covers a portion of a top surface of the first insulating layer,
wherein the first cover pad electrode covers a top and a side portion of the first upper pad electrode,
wherein the first cover pad electrode covers a side portion of the first lower pad electrode, and
wherein the second pad electrode covers a top portion of the first cover pad electrode.

15. The organic light-emitting display apparatus of claim 14, wherein:
the first cover electrode covers:
  a top and a side portion of the first upper electrode; and
  a side portion of the first lower electrode; and
the first cover auxiliary electrode covers:
  a top and a side portion of the first upper auxiliary electrode; and
  a side portion of the first lower auxiliary electrode,
wherein the first upper electrode is provided in a same pattern as the first lower electrode,
wherein a first end of the first cover electrode extends toward a first end of the first cover auxiliary electrode on the first insulating layer,
wherein the first end of the first cover auxiliary electrode extends toward the first end of the first cover electrode on the first insulating layer, and
a lateral surface of the first end of the first cover electrode faces a lateral surface of the first end of the first cover auxiliary electrode.

16. The organic light-emitting display apparatus of claim 14, wherein:
the first lower auxiliary electrode comprises a same material as the first lower electrode;
the first upper auxiliary electrode comprises a same material as the first upper electrode; and
the first cover auxiliary electrode comprises a same material as the first cover electrode.

17. The organic light-emitting display apparatus of claim 14, further comprising:
a second insulating layer on the first electrode;
a second electrode on the second insulating layer; and
a second auxiliary electrode on the second insulating layer,
wherein the second electrode is connected to the first electrode through a first contact hole in the second insulating layer, and
wherein the second auxiliary electrode is connected to the first auxiliary electrode through a second contact hole in the second insulating layer.

18. The organic light-emitting display apparatus of claim 17, wherein the first auxiliary electrode overlaps the second electrode.

19. The organic light-emitting display apparatus of claim 17, further comprising:
an organic emission layer on the second electrode; and
a third electrode on the organic emission layer, the third electrode being connected to the second auxiliary electrode.

* * * * *